(12) United States Patent
Nose

(10) Patent No.: US 6,202,180 B1
(45) Date of Patent: Mar. 13, 2001

(54) SEMICONDUCTOR MEMORY CAPABLE OF RELIEVING A DEFECTIVE MEMORY CELL BY EXCHANGING ADDRESSES

(75) Inventor: Shigeru Nose, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/094,699

(22) Filed: Jun. 15, 1998

(30) Foreign Application Priority Data

Jun. 13, 1997 (JP) .................................................. 9-171284

(51) Int. Cl.[7] .................................................. G11C 29/00
(52) U.S. Cl. ............................................ 714/718; 365/200
(58) Field of Search ................................ 714/718, 723, 714/710, 711, 719; 365/200, 201; 345/515, 516

(56) References Cited

U.S. PATENT DOCUMENTS

| 4,860,260 | * | 8/1989 | Saito ..................................... 365/201 |
| 5,058,069 | * | 10/1991 | Gaultier et al. ....................... 365/200 |
| 5,278,839 | * | 1/1994 | Matsumoto et al. ................. 714/710 |
| 5,353,253 | * | 10/1994 | Nakajima ............................. 365/200 |
| 5,357,523 | * | 10/1994 | Bogholtz, Jr. et al. ................ 371/27 |
| 5,539,697 | * | 7/1996 | Kim et al. ............................. 365/200 |
| 5,577,050 | * | 11/1996 | Bair et al. ............................ 371/10.2 |
| 5,677,880 | * | 10/1997 | Horiguchi et al. .................... 365/200 |
| 5,764,576 | * | 6/1998 | Hidaka et al. ........................ 365/200 |
| 5,936,900 | * | 8/1999 | Hii et al. .............................. 365/201 |

FOREIGN PATENT DOCUMENTS

| 3 116 497 | 5/1991 | (JP) . |
| 5 250 894 | 9/1993 | (JP) . |
| 8 255 500 | 10/1996 | (JP) . |

\* cited by examiner

*Primary Examiner*—Albert De Cady
*Assistant Examiner*—Shelly A Chase
(74) *Attorney, Agent, or Firm*—Oblon, Spivak, McClelland, Maier & Neustadt, P.C.

(57) ABSTRACT

A memory for controlling a display and which relieves a memory cell by exchanging an address when the memory has defective portions, including an external address input; a first memory circuit which stores an address corresponding to a specified portion of a display; a second memory circuit which stores an address provided to be faulty as a result of a test; and address converting circuit coupled to the external address input and the first and second memory circuits. The converting circuit outputs the address stored in the second memory circuit when an address supplied from the external address input coincides with the address stored in the first memory circuit and outputs the address stored in the first memory circuit when the address supplied from the external address input coincides with the address stored in the second memory circuit.

36 Claims, 21 Drawing Sheets

MP0,MN0,MP1,MN1: CONVERTING FROM VOLTAGE TO CURRENT
MP2,MN2,MP3,MN3: DIFFERENTIAL VOLTAGE AMPLIFIER (LINEAR AMPLIFIER)

SEMICONDUCTOR MEMORY CAPABLE OF RELIEVING A DEFECTIVE MEMORY CELL BY EXCHANGING ADDRESSES

BACKGROUND OF THE INVENTION

Field of the Invention

Discussion of the Background

A method has heretofore has been adopted, in which in order to relieve errors of semiconductor memories, spare row and column lines are additionally provided previously and the errors of the semiconductor memories are relieved by replacing row or column lines of defect memory cells regarded as faulty ones because of their errors.

The foregoing conventional method requires the semiconductor memory to provide the spare lines, resulting in a problem of a large chip size. In order to replace the row and column lines of the faulty memory cell with the spare line, it is necessary to write programs using fuses when a wafer test is conducted, and testing equipment for it is needed. Moreover, since there is sometimes a case where excessive processes must be conducted for an element for the fuse, leading to an increase in manufacturing cost. Besides the foregoing spare memory, as a error relief technology, there are also memory using an ECC (Error Checking and Correcting) technology, in which erroneous data is replaced with corrected data even when errors exist. This memory with ECC involves a problem that it has a memory capacitance larger than an original capacitance and has a large size chip because of addition of an ECC circuit. For example, in case of a 16M memory, the memory capacitance increases by 11 to 12%.

SUMMARY OF THE INVENTION

The present invention was made from viewpoint of such circumstances, and the object of the present invention is to provide a memory for controlling a display which is capable of relieving a memory cell simply by exchanging addresses without addition of a spare memory and an ECC circuit when errors exist in a memory. Furthermore, the object of the present invention is to provide a memory for controlling a display which is capable of relieving a memory cell by exchanging addresses with a high efficiency when errors exist in a memory.

To achieve the above object, the present invention provides a memory control circuit for a display comprising an external address input; a first memory circuit which stores address corresponding to a predetermined portion in a display; a second memory circuit which stores address found to be faulty as a result of testing; and address changing means coupled to the foregoing external address input and the foregoing first and second memory circuits, the address changing means outputting the address stored in the foregoing second memory circuit when address inputted thereto from the foregoing external address input is coincident with that stored in the foregoing first memory circuit, and outputting the address stored in the foregoing first memory circuit when the address inputted thereto from the foregoing external address input is coincident with that stored in the foregoing second memory circuit.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

Figure 1:
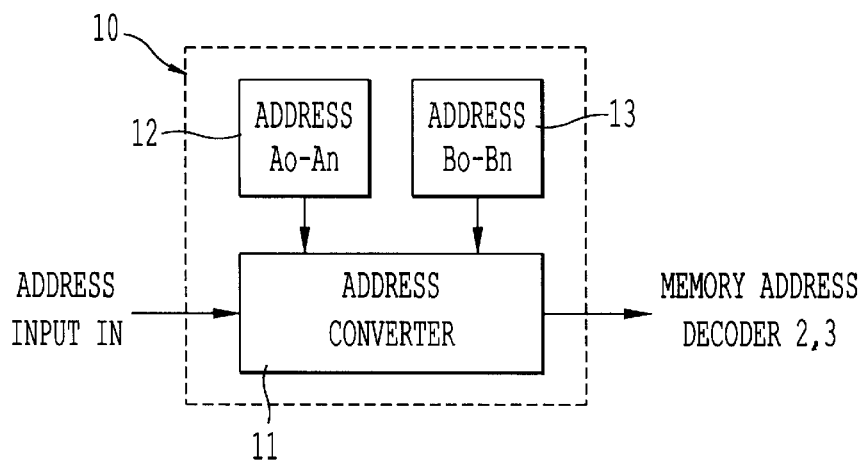
FIG. 1 is a circuit block diagram of an address exchanging circuit of the present invention.
Figure 2:
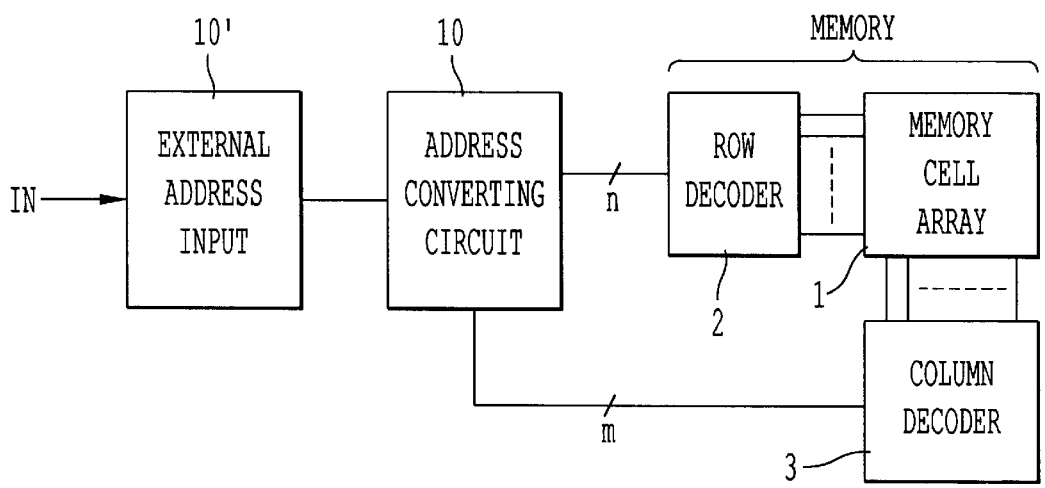
FIG. 2 is a circuit block diagram of a memory for a display, including the address exchanging circuit of the present invention.

First, referring to FIGS. 1 to 3, a first embodiment of the present invention will be described. FIG. 1 is a circuit block diagram of an address exchanging circuit and FIG. 2 is a circuit block diagram of a memory for controlling a display comprising this address exchanging circuit. As shown in FIG. 2, a row decoder 2 and a column address decoder 3 are coupled to a memory cell array 1. An output from the address changing circuit 10 is inputted to these decoders. Specifically, address signals are inputted to an address exchanging circuit 10 from an address input terminal IN constituting an external address input 10' which comprises a row address buffer and a column address buffer. An output signal, which is outputted to a memory address decoder such as the row and column decoders 2 and 3, is generated from the address exchanging circuit 10. The memory cell array 1, the row decoder 2 and the column decoder 3 constitute a memory circuit section of a memory for controlling a display.

As shown in FIG. 1, the address signals are supplied to the memory address decoders 2 and 3 via an address converter 11 form the address input terminal IN for receiving row and column addresses. The address converter 11 compares address data from an address input with address data of two systems. One is supplied from a memory circuit which stores addresses (A0 to An) corresponding to a periphery portion of a display section of a display device, and the other is supplied from a memory circuit 13 which stores specified addresses (B0 to Bn) that are the ones corresponding to a memory cell array judged to be faulty by a test. When the address coincides with the periphery portion address Ai, the address of the specified address Bi is outputted to the memory address decoders 2 and 3. When the address coincides with the specified address Bi, the periphery portion address Ai is outputted to the memory address decoders 2 and 3.

Figure 6:
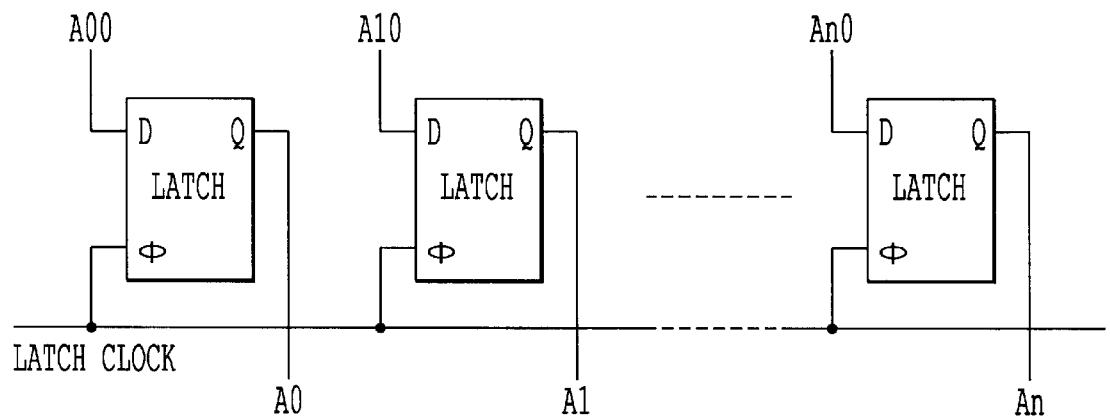
FIG. 6 is an example of a circuit constitution of a memory circuit 13.
Figure 7:
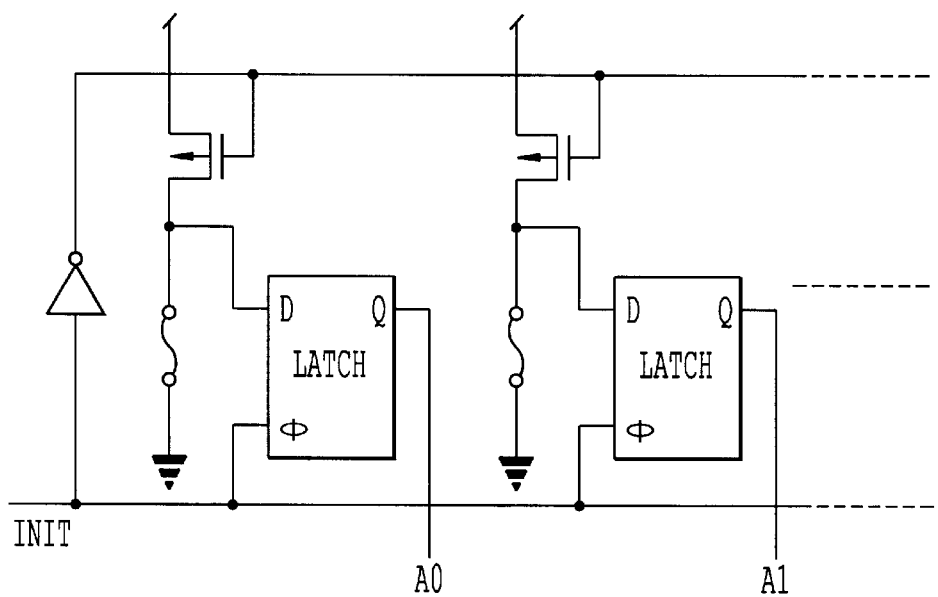
FIG. 7 is another example of a circuit constitution of a memory circuit 13.

An example of a concrete circuit constitution of the memory circuit 13 is shown in FIGS. 6 and 7. The memory circuit 13 has a plurality of latching circuits as shown in FIG. 6. The address signals for test whether the address ought to be repaired are A0 to An, which are taken into the D inputs, respectively. As A0 to An, the signals are outputted to the address converter 11 from the Q outputs, respectively. Furthermore, the latching clock is supplied from a tester used to decide whether an integrated circuit (IC) satisfies a desirable performance, in the case test whether the address ought to be repaired.

FIG. 7 shows the memory circuit 13 using the fuse. In case of this circuit, in order to suppress the current consumption, the address having the errors is previously taken into the latching circuit by the initial signal when the operation starts. Similarly to the circuit of FIG. 6, the signals as A0 to An are outputted from the Q outputs to the address converter 11, respectively.

Also in case of errors other than the least significant bit (hereinafter, referred to as LSB), if the address of LSB is previously set as the address for a relief, the faulty address is used as the LSB, so that deterioration of a display can be lessened. If the address for a relief is set as the LSB of the periphery, influences by the error can be more reduced.

The above-described address exchanging circuit 10 is applied to the relief of the memory cells. When errors exist in the memory cell of the address corresponding to the periphery of the display, no relief is performed. When the errors exist in the memory cell of the address corresponding to the portion other than the periphery of the display, the errors are moved into the periphery of the display. In the comparison of the foregoing addresses, when the address coincides with the specified address Bi, the movement of the errors is performed by outputting the periphery portion address Ai. Otherwise, when errors exist in the MSB data of pixel data, this faulty address is converted to the LSB address to relief it, whereby a yield of mass storage memory can be increased.

Figure 4:
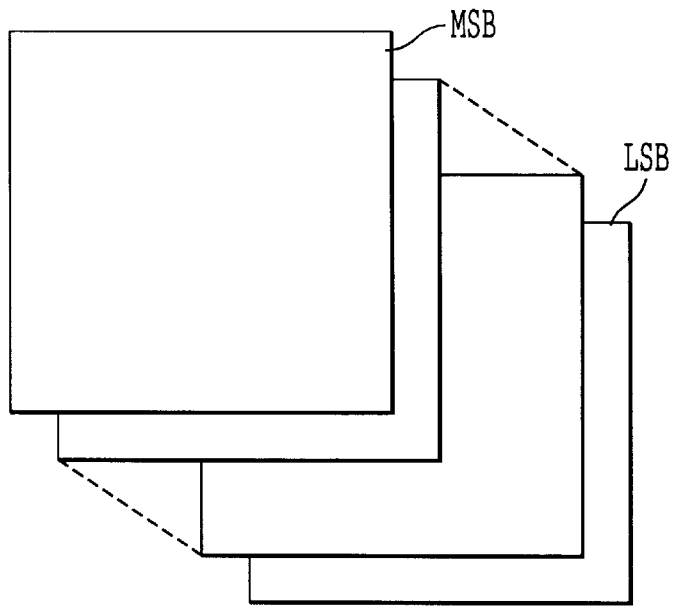
FIG. 4 is a drawing of imaging the formation of an actual image by superposing the image for each bit.

Concretely, the pixel data form a layer structure shown in FIG. 4. It is considered that a plurality of layers are superposed and an actual display is formed. The MSB data (Most Significant Bit) data is the pixel data of the uppermost layer and the LSB data is the pixel data of the lowermost layer. Here, if there are errors in the MSB data, the errors appear definitely on the display. On the other hand, if there are errors in the LSB data, the errors do not appear so definitely. Therefore, there is a significance in exchanging the address of the faulty MSB data for the address of the LSB data.

Figure 3:
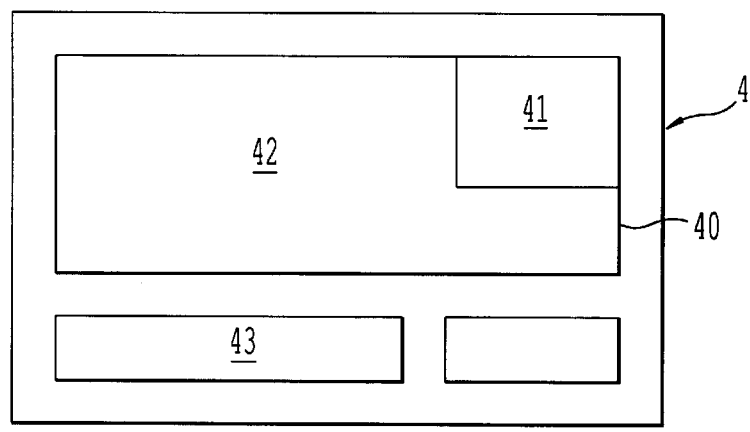
FIG. 3 is a block diagram of an image in which the memory for a display of the present invention is used.

FIG. 3 is a schematic view of a television. 4 is a total composition of image displaying apparatus. This image display apparatus includes display 40 comprising two displays. The two displays composed of the main display 42 and the sub display 41 are simultaneously displayed. The sub display is stored in the memory, and the image data is read out at the time of sub displaying. In this case, in the case where there are errors in the memory corresponding to the center of the sub display 41, a viewer sometimes feels uneasy in spite of one pixel. However, if the errors exist in the periphery of the sub display, the viewer does not feel uneasy. The display 4 is controlled by the control section 43.

Figure 5:
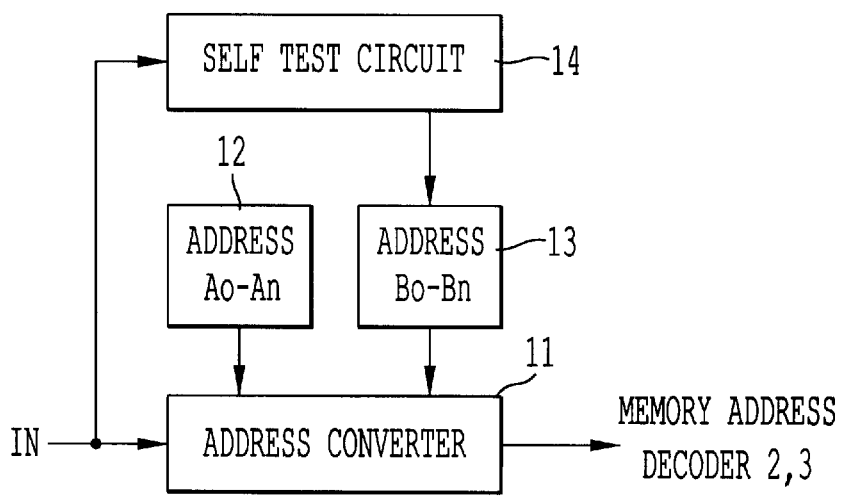
FIG. 5 is a circuit block diagram of an address exchanging circuit of the present invention.

Next, a second embodiment of the present invention will be described with reference to FIG. 5. FIG. 5 is a circuit block diagram illustrating an address exchanging circuit which using no fuse, relieves the errors of the memory. In this circuit, when the errors are found during checking by the self test circuit 14 at the time of power-on, the address having the errors is stored in the memory circuit 13, whereby an operation is conducted instead of ordinary program written by the fuse.

As shown in FIG. 5, an address signal is supplied to the memory address decoders 2 and 3 from the address input terminal In via the address converter 11. The address converter 11 compares the address data inputted to the address input with the address data of two memory blocks, one of which is from the memory circuit 12 storing the addresses (A0 to An), and the other of which is from the memory circuit 13 storing the specified addresses (B0 to Bn).

The self test circuit 14 operates at the power-on time and the like. The address, the writing data and the expected value are supplied from the self test circuit 14, and the operations of all memory addresses are checked. The address found to be faulty as a result of testing is stored in the memory circuit 13. When it is actually used, the address is compared with the address data B0 to Bn of the memory circuit 13. Both are coincident with each other, the address data of the memory circuit 12 is used as the address. Here, when the address Ai corresponding to the periphery of the display is used as the address data of the memory circuit 1 like the case of FIG. 1, a circuit for exchanging the address can be adopted, whereby a repairing memory that is a memory storing the address of the spare row and column can be omitted, resulting in a reduction in a chip size.

Next, a third embodiment of the present invention will be described with reference to FIGS. 8 and 9. Both of FIGS. 8 and 9 are a circuit block diagram of a memory circuit including an address exchanging circuit which relieves errors of the memory by self test circuit and spare memory.

Figure 8:
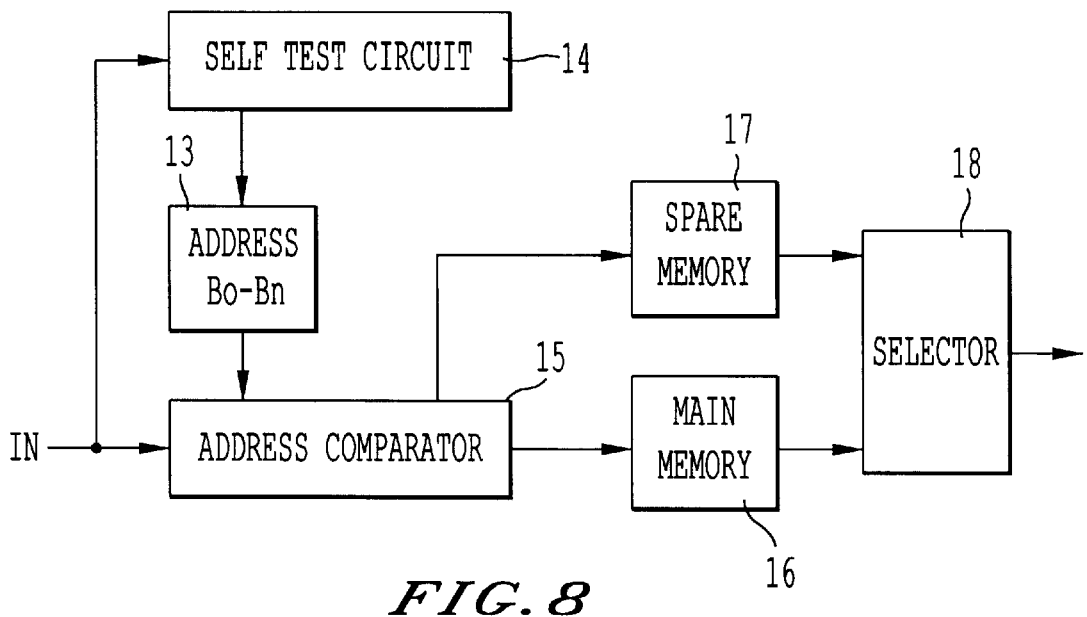
FIG. 8 is a circuit block diagram of a memory for a display, including an address exchanging circuit of the present invention.
Figure 9:
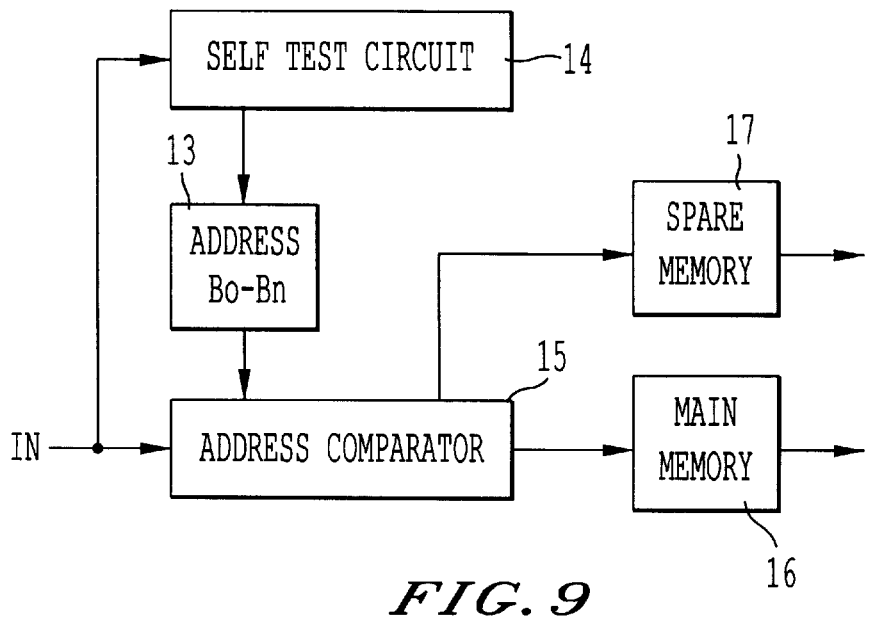
FIG. 9 is a circuit block diagram of a memory for a display, including an address exchanging circuit of the present invention.

As shown in FIG. 8, an address signal is supplied via the address comparator 15 from the address input terminal IN to the main memory 16 of a memory cell array which constitutes a memory section. To the memory circuit 13, the address (specified address) regarded as the faulty address based on the result of testing is inputted from the self test circuit 14. The circuit of FIG. 8 is constituted as follow. In the case that the address signal is coincident with the address stored in the memory circuit 13, the spare memory is activated, stores a data corresponding to the address stored in the memory circuit 13 and outputs without conversion of the address. In the circuit of FIG. 8, the selector 18 controlled by the output of the address comparator 15 selects one of the outputs of the main memory 16 and the spare memory 17. FIG. 9 shows a circuit in which spare use (enable)/spare non-use (disable) signal is added and the selector 18 of FIG. 8 is omitted.

Figure 10:
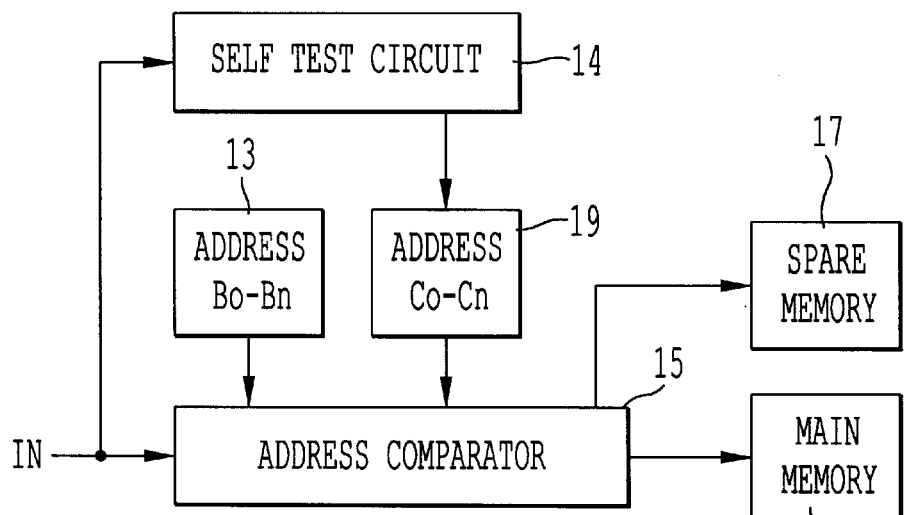
FIG. 10 is a circuit block diagram of a memory for a display, including an address exchanging circuit of the present invention.

Next, a fourth embodiment of the present invention will be described with reference to FIG. 10. FIG. 10 is a circuit block diagram of a memory circuit including an address exchanging circuit which relieves errors of the memory. The self test circuit 14 operates at the time of power-on and the like. The address, the writing data and the expected value are supplied to the self test circuit 14, and operations of all memory addresses are checked. The address which is found to be faulty as a result of testing is stored in the memory circuit 13. In the case being disable to repair data by spare memory 17, decided to be fault, a spare-over flag is stored in the memory circuit 13, with the address which is found to be faulty. Simultaneously, a flag showing it is capable of exchanging data between spare memory and main memory, per an address is stored in the memory circuit 19. When the address exchanging circuit of FIG. 10 is actually used, the address data B0 to Bn of the memory circuit 13 is compared with the address data inputted from the address input IN. When both are coincide with each other, and the spare-over flag is activated, the address data C0 to Cn of the memory circuit 19 is used as the address. Here, the address Ci corresponding to the periphery of the display is used as the address data of the memory circuit 19 like the case of FIG. 1. On the other hand, when the address data B0 to Bn of the memory circuit 13 is coincident with the address data inputted from the address input IN and the spare overflag is not activated, the address exchanging circuit of FIG. 10 is constituted such that the output data is replaced by the output data of the spare memory circuit 17 without converting the address. When the address C0 to Cn is coincident with the address data inputted from the address input IN, and a flag being capable of exchanging is activated, the address data inputted from the address input IN is exchanged to the address data B0 to Bn. When the address C0 to Cn is coincident with the address data inputted from the address input IN, but a flag being capable of exchanging is not activated, the address data inputted from the address input IN is outputted directly without exchanging to the address data B0 to Bn. As described above, in the embodiment of the present invention, it is possible to cope with the faulty address by utilizing the spare memory circuit and the address interchange. In this case, it is also possible to classify the products into the ones that can be perfectly replaced with the spare memory and others that can not be replaced, according to the specification of them used in the test at the time of shipping.

Figure 11:
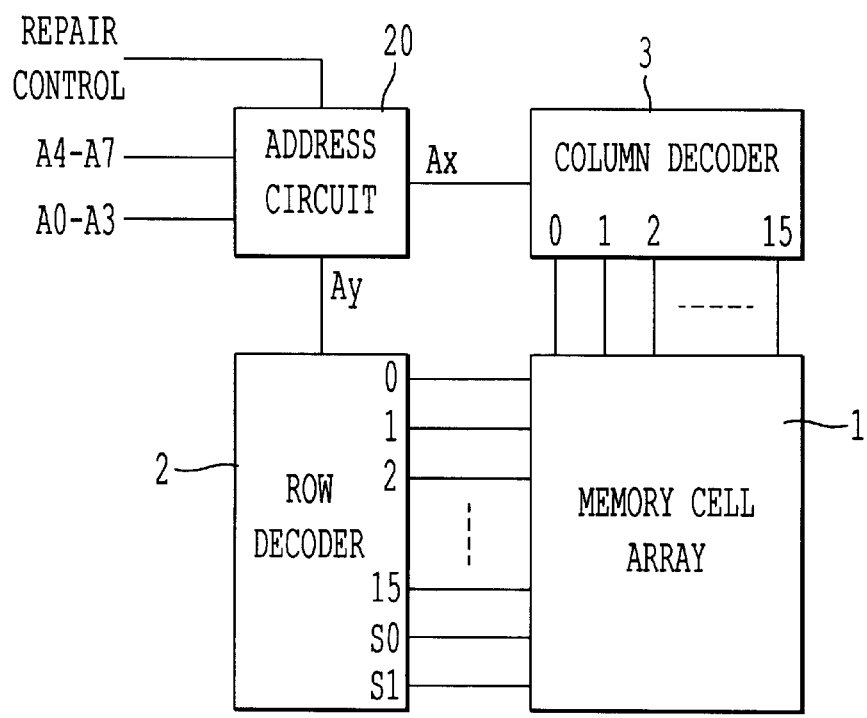
FIG. 11 is a circuit block diagram of a memory for a display, including an address exchanging circuit of the present invention.
Figure 12:
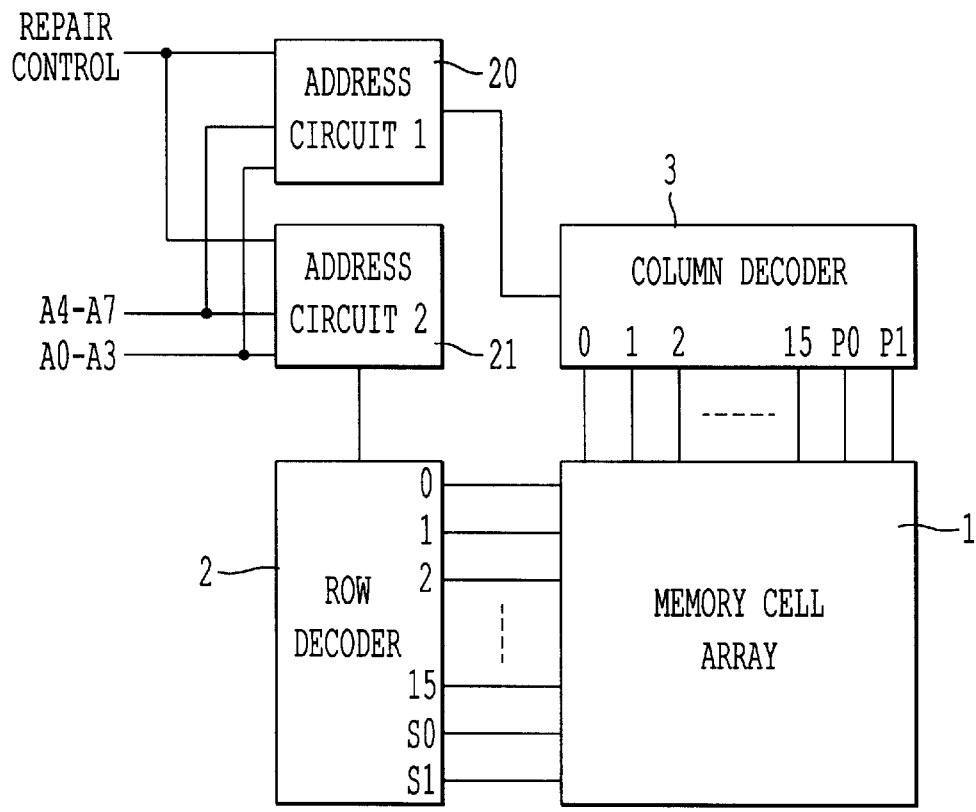
FIG. 12 is a circuit block diagram of a memory for a display, including an address exchanging circuit of the present invention.

Next, a fifth embodiment of the present invention will be described with reference to FIGS. 11 and 12. FIGS. 11 and 12 are a circuit block diagram of a memory for controlling a display. In the memory in which spare row and column lines are prepared, when there are, for example, four repair row lines and four repair column lines, and when there are five row lines to be repaired and two column lines to be repaired, it is impossible to repair with an ordinary memory. Therefore, the product is dealt as faulty one.

In this embodiment of the present invention, by the use of an address circuit capable of switching the address of the repair memory between the row address of the original memory address and the column address thereof, an memory for a display which can effectively increase the number of repairs with addition of the less number of circuits is provided.

FIG. 11 shows an example of the address circuit 20 having the spare memory constituted only by the row lines. For the simplicity of description, the case where the address is composed of 8 bits and the row and column address are composed of 4 bits (the row address: A0 to A3 and the column address: A4 to A7) is shown. For example, when the address A0 to A3=(0101) and the address A4 to A7=(1010) are repaired, either the repair row line 80 or the repair row line S1 is selected by the row decoder output repair column signal Ay. As the signal Ax inputted to the column decoder, the column addresses A4 to A7 are used as the time of repairing the row lines, and the row addresses A0 to A3 are used as the time of repairing the column lines.

FIG. 12 shows an example of the memory circuit including the address circuits 20 and 21. In the circuit block diagram of FIG. 12, provided are the address circuit 20 driving the row lines in the memory cell array, and the address circuit 21 driving the column lines in the memory cell array. Since the row address and the column address can be interchanged by the control signal at the time of repairing the row line or the column line, the number of repairing can be effectively increased with addition of the less number of circuits.

Figure 13:
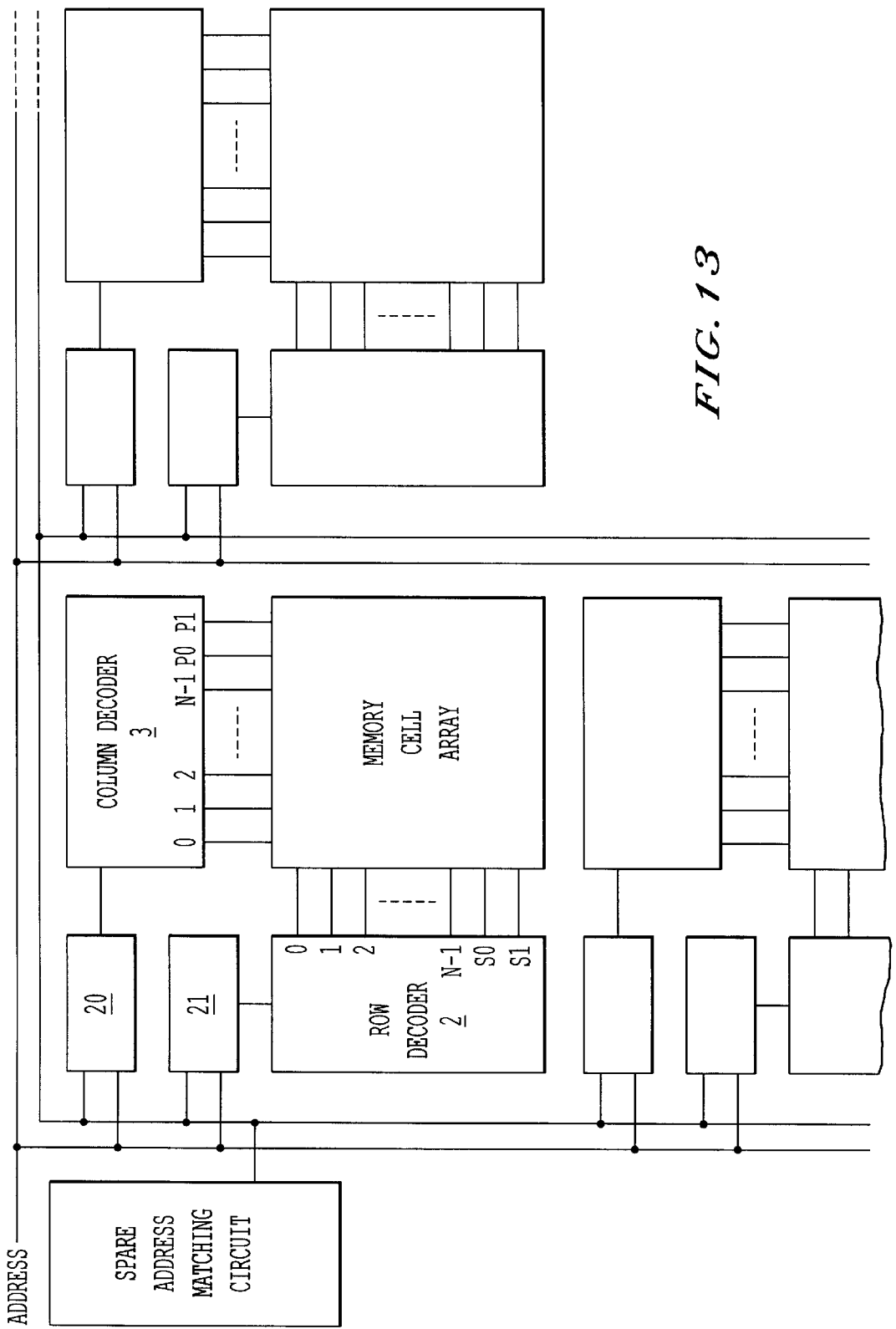
FIG. 13 is a circuit block diagram of a memory comprising a plurality of memory block, including an address exchanging circuit of the present invention.

FIG. 13 is a block diagram of the memory including a plurality of memory blocks. In conventional memory circuit, if the spare row lines S0, S1 in block are in use, it is capable of using a spare row line which is not in use in other block. However, it is impossible to repair a row line which is found to be in fault, if all spare row lines are in use in all blocks.

In this embodiment shown in FIG. 13, the spare address matching circuit is capable of exchanging between row line and column line so that it is capable of repairing the row line found to be in fault by column spare line which is not in use. The spare address matching circuit decides which row spare line or column spare line should be used, and which spare address should be used in the case when the spare address matching circuit receives an address found to be in fault. Moreover, the spare address matching circuit controls an address exchanging circuit and I/O circuit.

Next, a sixth embodiment of the present invention will be described with reference to FIGS. 14 and 15. In the embodiment of the present invention, means is provided, which designates in accordance with an external signal the address to be interchanged with the position of the periphery of the display.

When the unit of repairing is set to be large, the errors become occasionally though they are at the periphery of the display. For example, when there is a block for repairing at the caption of movies, the errors may be remarkable. In this case, it is possible to cope with such situation by converting the repairing block to the address corresponding to the left end portion of the display where no caption is present.

Figure 14:
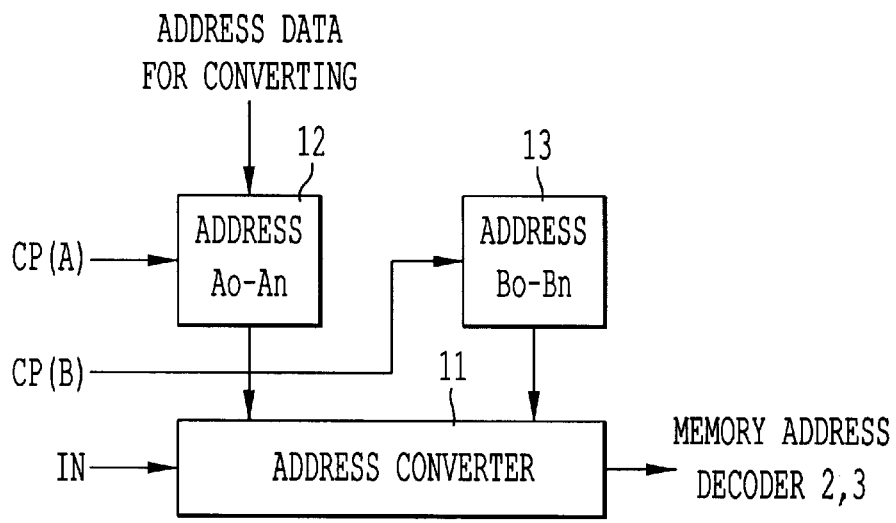
FIG. 14 is a circuit block diagram of an address exchanging circuit of the present invention.

The circuit of FIG. 14 receives data inputted to the address circuit (for example, register) 12 of FIG. 1 from the outside and interchanges the faulty address data with this data, when the viewer notices the existence of the errors on the display. This interchange can be performed without inputting all data necessarily, and programming is also possible so that detailed address exchanging procedures can be previously determined by software/hardware according to rough instructions.

Figure 15:
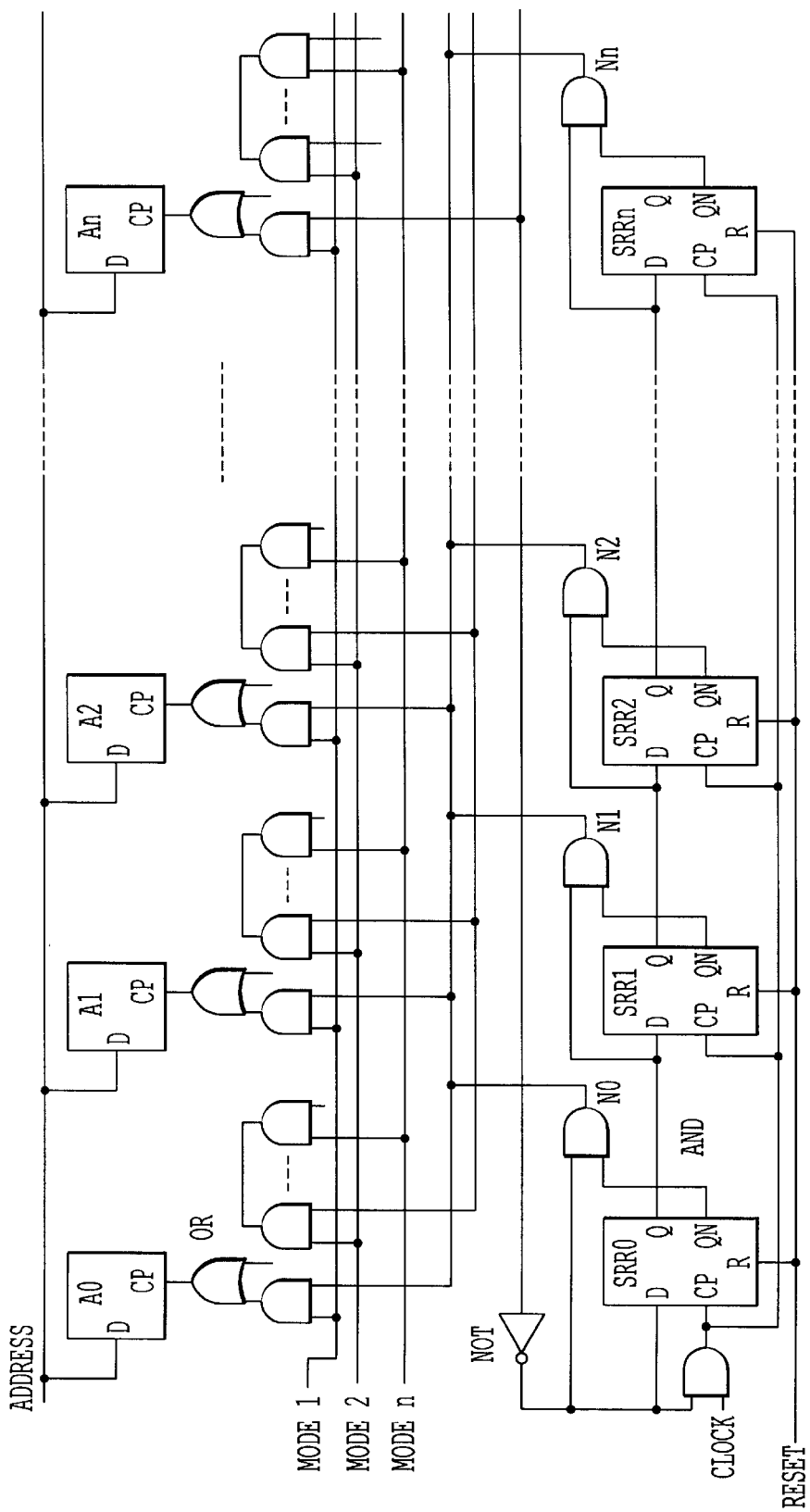
FIG. 15 is a circuit diagram showing a part of the address exchanging circuit used for the memory for a display of the present invention.

A circuit example is shown in FIG. 15, which by changing the priority order for allocation to the repairing depending on an external signal, uses for repairing no address of the desired position of the display. This circuit effectively writes the NG addresses sequentially according to a style by a later described self test.

In the circuit shown in FIG. 15, the shift registers SRR0 to SRRn have a reset terminal are reset to be "0" in level by the reset signal RESET. Therefore, since one input terminal of the logic product circuit having the other terminal which receives the clock signal CLOCK is changed to be "1" in level, the signal CLOCK is inputted to the clock terminal CP of each of the shift registers SRR0 to SRRn. Pulses are generated in the order of N0, N1, N2, . . . , and Nn every a clock pulse. Depending on which the signals mode 1 to mode n is "1", it is possible to select any of the registers A0 to An to be taken in the address signal at this timing.

In the circuit shown in FIG. 15, in the case where the timing pulses of the signals mode 1 and mode 2 are generated in this order, when the signal mode 1 is "1", the first address is taken into the register A0 and the second address is taken into the register A1. When the signal mode2 is "1", the first address is taken into the register A1 and the second address is taken into the register A0.

The registers A0 to An of FIG. 15 are equivalent to the registers B0 to Bn of the memory circuit 13 used in FIG. 1 and the like. If addresses to which no memory cells correspond are inputted to the register which is not used for repairing, the address of low priority order is not used when all spare (peripheral) address is not used, so that it is possible to achieve the desired object. Additionally, a flag register which shows to be used as added in the memory circuit 13, instead of inputting the address to which no memory cells correspond, and when the flag register is not need to be used, the flag register is not activated, so that it is possible to achieve the desired object.

Figure 16:
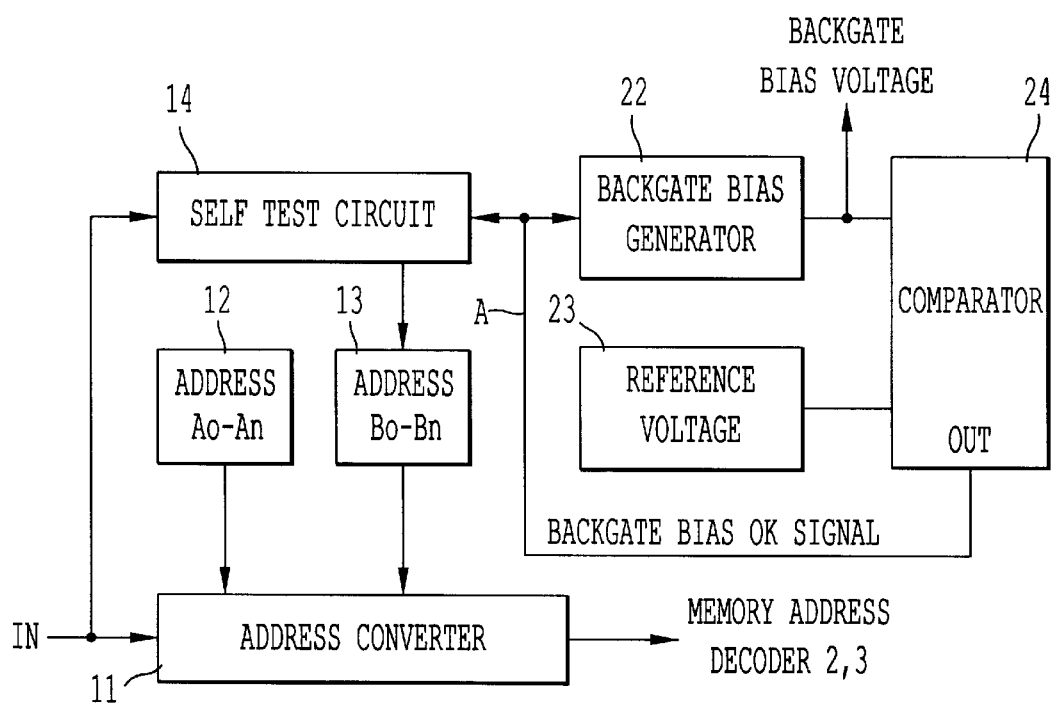
FIG. 16 is a circuit block diagram of an address exchanging circuit of the present invention.

Next, a seventh embodiment of the present invention will be described with reference to FIGS. 16, 17 and 32. FIG. 16 is a circuit block diagram of a power rising detection circuit (not shown) used in FIG. 5, which is built in the self test circuit 14, and is realized utilizing a substrate bias generation circuit. The circuit block diagram of FIG. 15 comprises the substrate bias generating circuit 22 and the comparator 24. The substrate bias voltage and the reference voltage 23 are compared by the comparison circuit 24 and the output of the comparison circuit 24 is inputted to the self test circuit 14 and the substrate bias voltage generating circuit 22.

Figure 32:
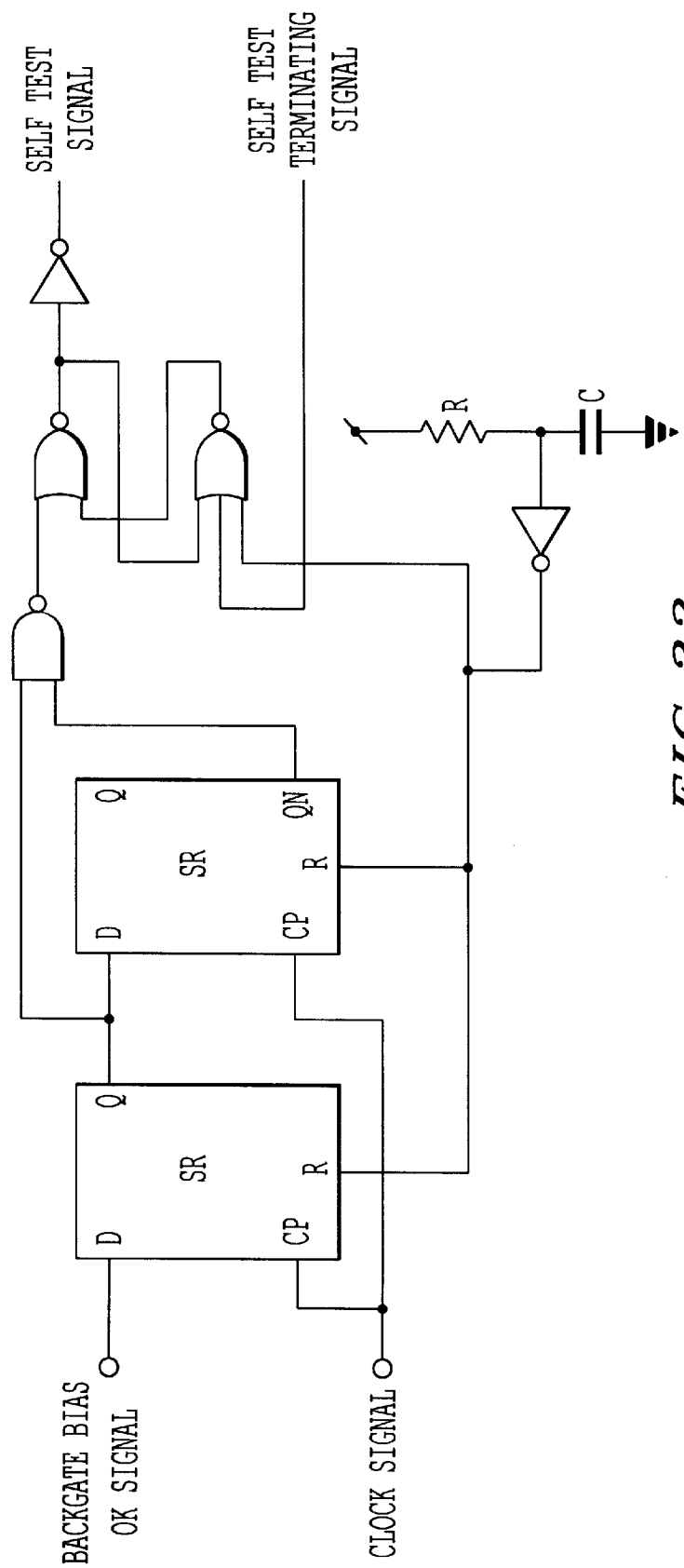
FIG. 32 is a circuit diagram showing a part of a self-test circuit used in the address exchanging circuit section of FIG. 16.

FIG. 32 shows a circuit which receives a substrate bias OK signal indicating that the substrate bias voltage initially becomes a predetermined voltage, and outputs a self test signal to the self test circuit 14. This circuit is built in the self test circuit 14. Because of providing this circuit in the self test circuit 14, the test is conducted after the substrate bias voltage becomes a predetermined level, so that at the time of actual operation, operation margins of the self test can be set to be equal.

Figure 17:
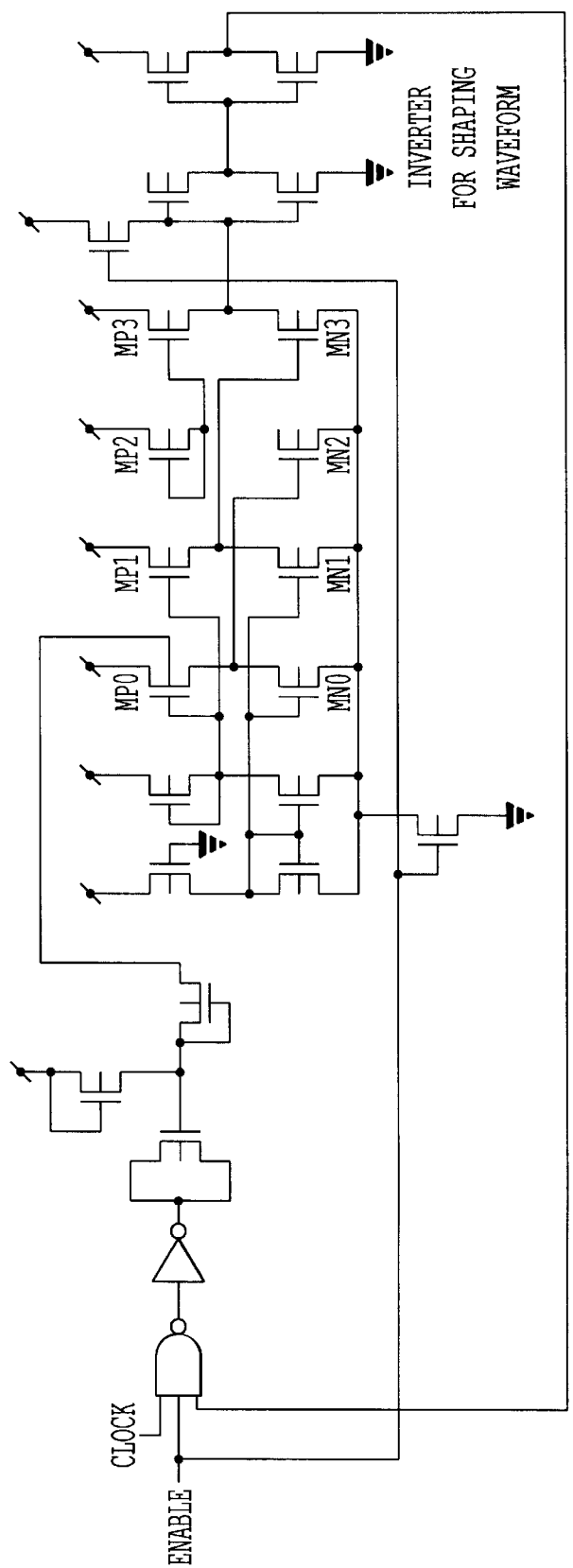
FIG. 17 is a circuit diagram of a substrate bias generation circuit used for the memory for a display of the present invention.

FIG. 17 is an example of the substrate bias generating circuit 22 of FIG. 16. A substrate bias is applied to the PMOS transistor MP0, and no substrate bias is applied to the PMOS transistor MP1. When the substrate bias is applied sufficiently, the channel length and the channel width of MP0 and MP1 is set up to be equalize the current of MP1 with that of MP0. The current of MP0 and MP1 is converted to a voltage of MN0 and MN1 added same voltage each other. A difference between the voltage to which the current of MP0 is converted and the voltage to which the current of MP1 is converted is amplified by an amplifier comprises MP2, MN2, MP3, MN3. If the substrate bias is not applied sufficiently, the current of MP0 is larger than that of MP1. Consequently, the output of the amplifier comprises MP2, MN2, MP3, MN3 is "H", so that the A' becomes "H".

Here, the signal shown in FIG. 17 corresponds to the inverted signal of the substrate bias OK signal A shown in FIG. 16, and the signal A' is "H", so that the substrate bias generating circuit 22 operates. Therefore, the signal A' is "L" and the substrate bias OK signal rises up.

Figure 18:
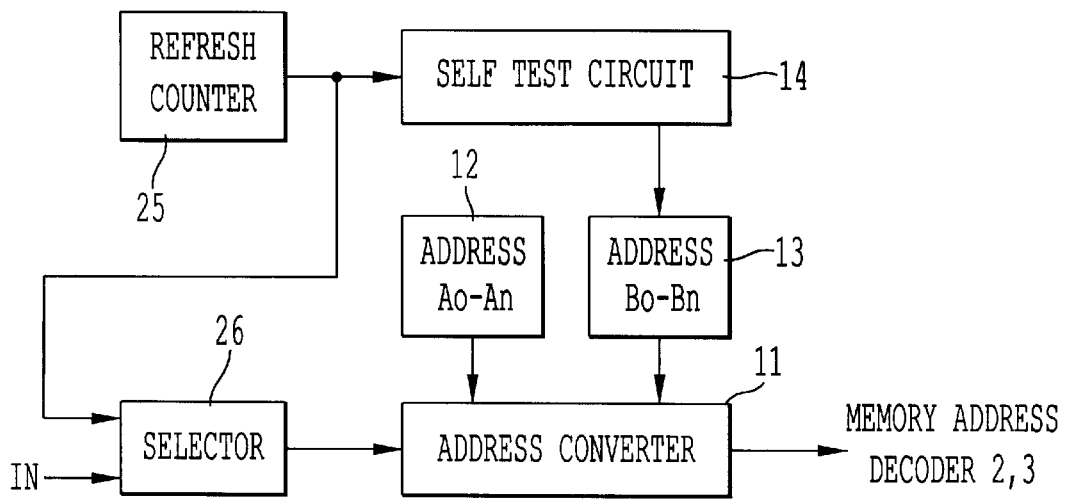
FIG. 18 is a block diagram of an address exchanging circuit of the present invention.

Next, an eighth embodiment of the present invention will be described with reference to FIG. 18. The circuit of FIG. 18 uses the refresh counter 25 as the address generating circuit used for the self test. Specifically, the address converting circuit further comprises the counter 25 for refreshing used for generating addresses of the self test, and the selector 26 which receives the address input IN and the output of the refresh counter 25 to select any of them. In this embodiment, it is unnecessary to provide an address counter of the self test additionally, the refresh counter is used instead of the address counter, leading to the preventing an increases in a semiconductor chip size.

Figure 19:
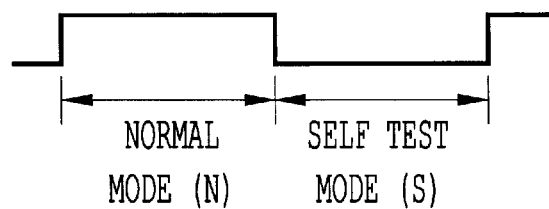
FIG. 19 is a timing chart of the memory for a display of the present invention.
Figure 20:
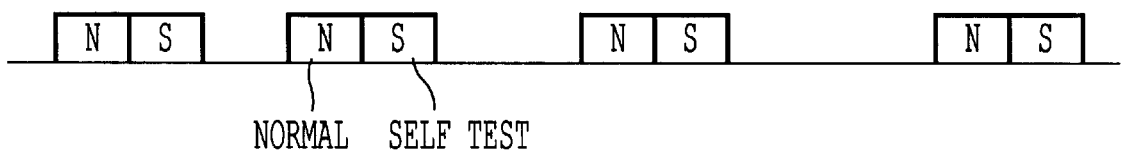
FIG. 20 is a timing chart of the memory for a display of the present invention.

Next, a ninth embodiment of the present invention will be described with reference to FIGS. 19, 20 and 21. Although the conditions are not changed significantly from the time of power-on in the appliances such as a television, the use conditions differs in some cases from that at the time of power-on, and the case may occur where at the time of the condition of the memory circuit is "OK" and after the condition of the memory circuit is "NG". As the countermeasure for this, one is a method in which the conditions of the self test at the time of power-on is set to be slightly stricter than ordinary use conditions. Another one is to provide a circuit which always performs the test and immediately switches from "normal mode" to "self test mode" in the case the condition is "NG". As a method to usually perform the test, in the type to operate in synchronization with clocks, a method in which two operations are alternately performed as shown in FIG. 19 is considered. Even in the case of an asynchronous operation, a self test operation (self test mode) is performed after a normal operation (normal mode) as shown in FIG. 20, whereby the alternate operation can be realized.

Figure 21:
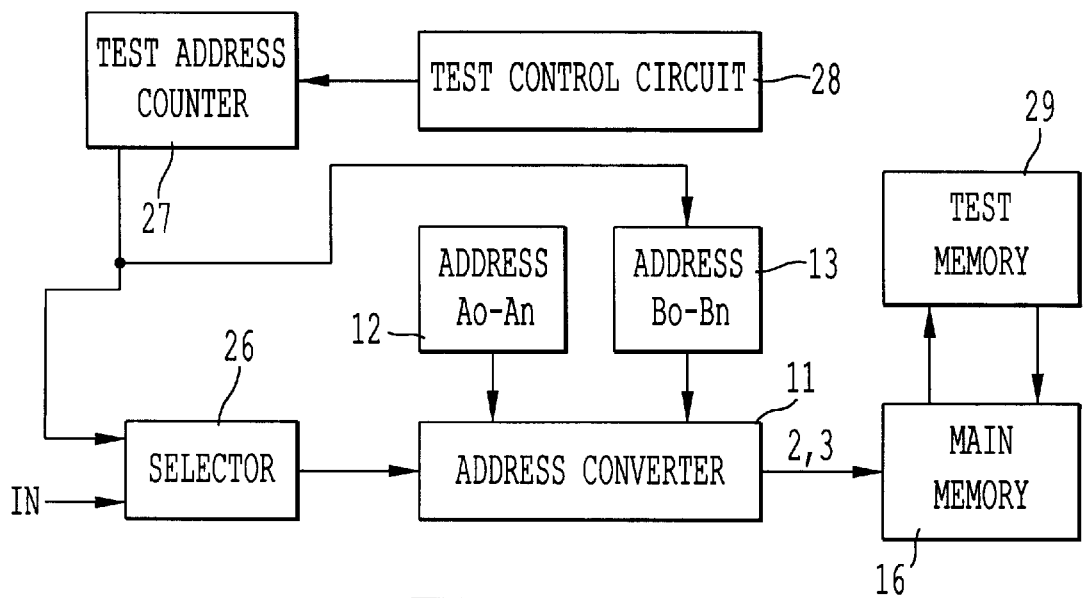
FIG. 21 is a circuit block diagram of a memory for a display, including an address exchanging circuit of the present invention.

The address converter circuit of FIG. 21 comprises the test address counter 27 used for address generation of the self test and the selector 26 which receives both of the address input IN and the output of the test address counter 27 to select any of them. The address signal is supplied from the address input terminal IN to the memory address decoders 2 and 3 (not shown, included in the main memory 16) via the address converter 11. The address converter 11 compares the address data inputted to the address input with the address data of the two systems, one being from the memory circuit 12 which stores the address (A0 to An) and the other being from the memory circuit 13 which stores the address (B0 to Bn). To the memory circuit 13, inputted is the address found to faulty based on the test result controlled by the test control circuit 28. Therefore, the foregoing specified address is the faulty address. The test address counter 27 and the test control circuit 28 constitute, for example, the self test circuit 14 of FIG. 5. In FIG. 21, the data of the address indicated by the self test address counter 27 is once transferred to the self test memory circuit (a shelter memory) 29. At this point, in the case where the tested address is inputted at the timing of the normal operation, the shelter memory is set so as to be accessed. In the second test cycle, the data "0" is written as the test data, and, in the third test cycle, the data is read out. In the fourth and fifth test cycles, data "1" is written and read out, respectively. In the sixth test steps, the sheltered data is written. As described above, the test for one address is performed with the six steps.

Figure 22:
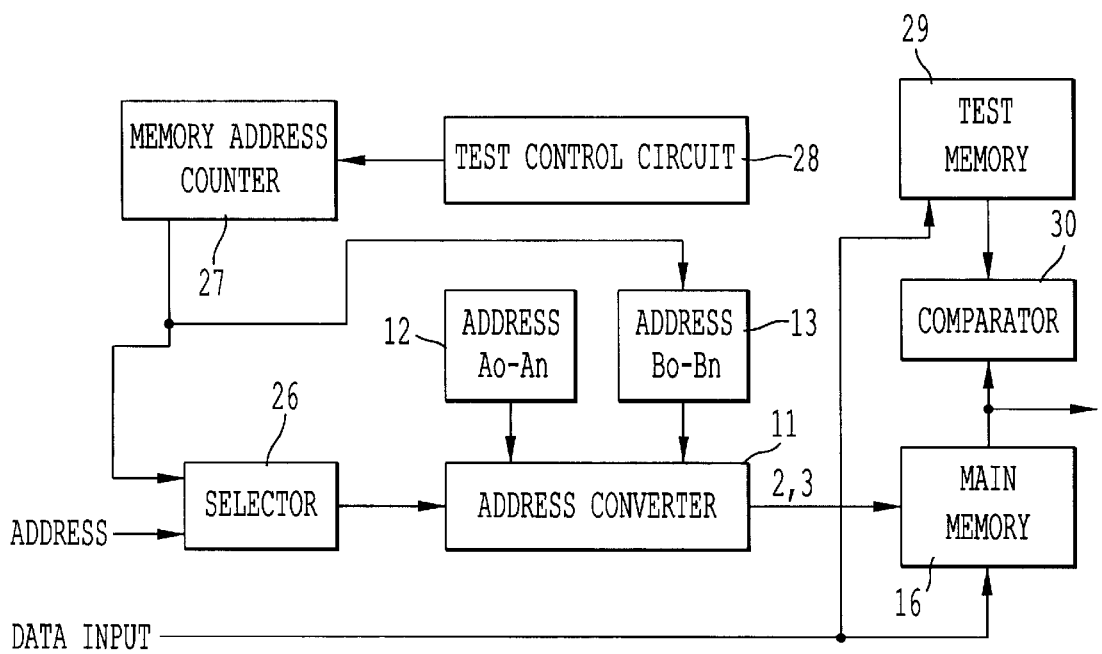
FIG. 22 is a circuit block diagram of a memory for a display, including an address exchanging circuit of the present invention.

Next, a tenth embodiment of the present invention will be described with reference to FIG. 22. FIG. 22 shows a circuit which performs the self test during an actual operation. This circuit of FIG. 22 writes the data to the tested address during the actual operation and writes it also to the self test memory circuit, and the comparator 30 in this circuit of FIG. 22 compares both data during reading-out operation to perform the test. The memory for testing is not used for sheltering the data but for simultaneous writing. In the case where FIFO memory is used, a reduction in an operation speed due to the self test is avoided.

Next, an eleventh embodiment of the present invention will be described with reference to FIGS. 23, 24 and 25. This embodiment of the present invention has a feature in that the self test memory circuit 29 of FIGS. 21 and 22 is arranged in the column section of the memory cell array.

Figure 23:
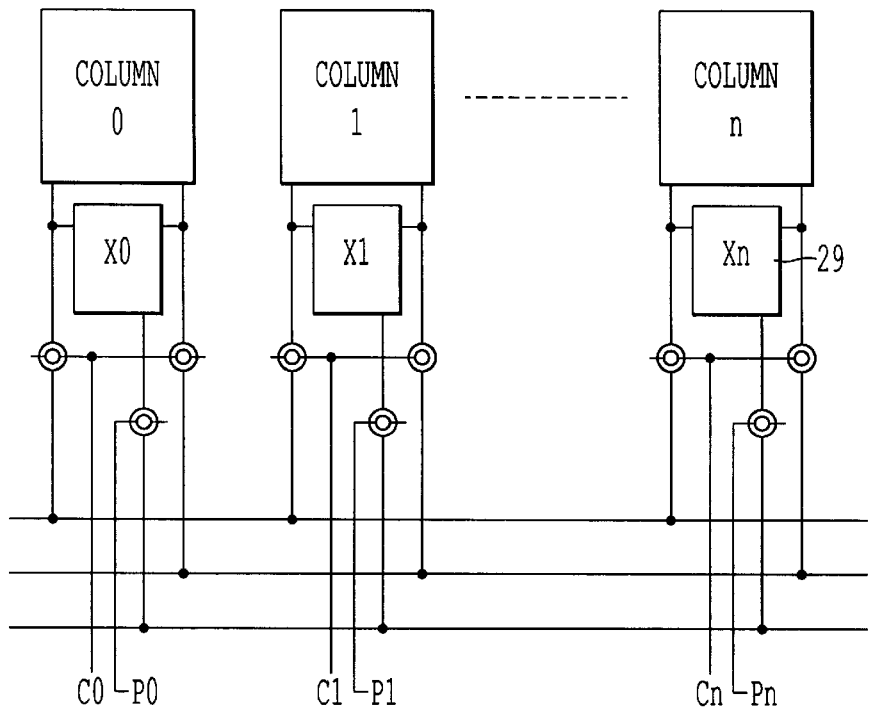
FIG. 23 is a circuit diagram of a column section of the memory for a display of the present invention.

FIG. 23 is a circuit in which the memory circuit 29 is disposed at the column section of the memory cell array. The circuit of FIG. 23 exhibits an advantage that wiring portions are reduced, and in the circuit, since many memory circuits can be arranged with a small area increase, a high speed self test can be performed. If this circuit is used for an actual operation repair system, even though the data holding time of the tested circuit is performed in the actual used state, the test is completed in a short time. For example, assuming that one self test memory circuit is arranged in 512 memory cells and each of the memory cells is refreshed every 512 cycles, the self test for one memory cell is conducted once a 512 cycles, so that the test is completed after 512×512=262144 cycles. In the case where one cycle is 140 ns (2 fsc of the NTSC signal), the test is completed for about 37 ms. In this case, for addresses that causes malfunctions due to operation margin of the device during the use of the memory device, erroneous state for several displays are only displayed continuously, and repairing is completed and it is possible to get the normal display again.

Figure 24:
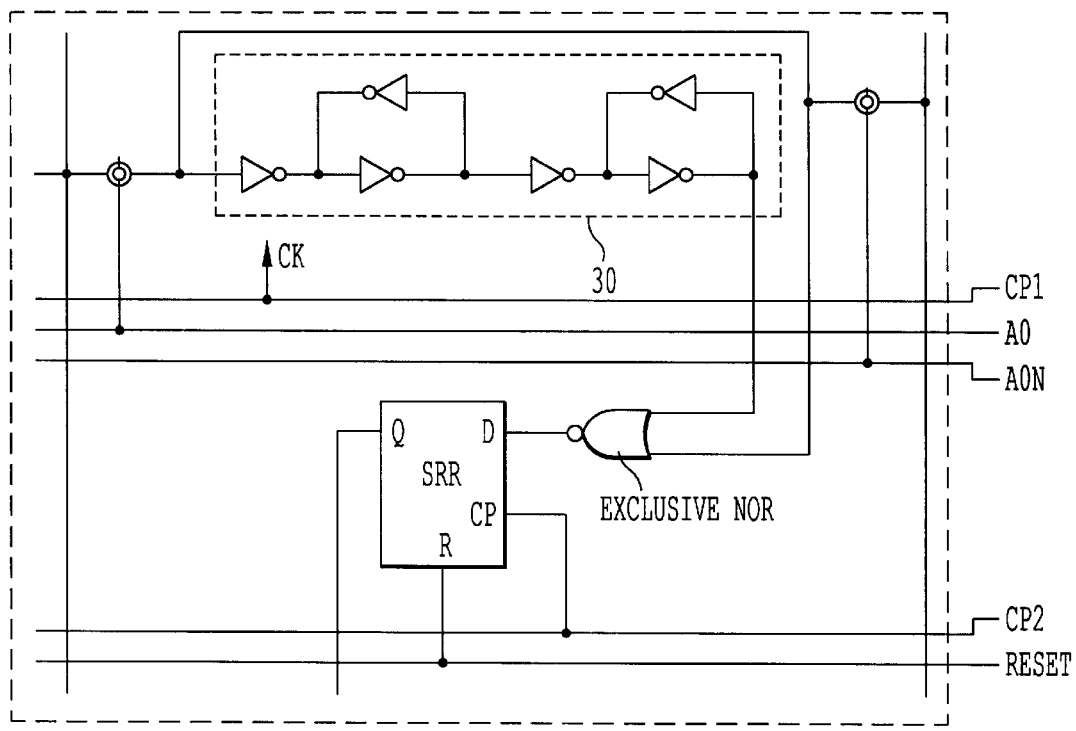
FIG. 24 is a circuit diagram of a memory circuit section for a self-test.

In FIG. 24, the self test memory circuit (Xi) 29 of FIG. 23 is shown in detail. The data of the bit line pair to be taken into is selected by the signals A0 and A0N, and the data to be written to the memory cell is taken also into the shift register 30 with a timing of the CP1 signal. Next, at the time of reading-out, the data read out from the memory cell and the data of the shift register 30 are compared. The comparison result is taken into the shift register with a reset terminal with a timing of the CP2 signal and held therein.

FIG. 23 is an example of an arrangement of one self test memory cell for one column. A circuit in which one self test memory is shared by two column or more may also be adapted.

Figure 25:
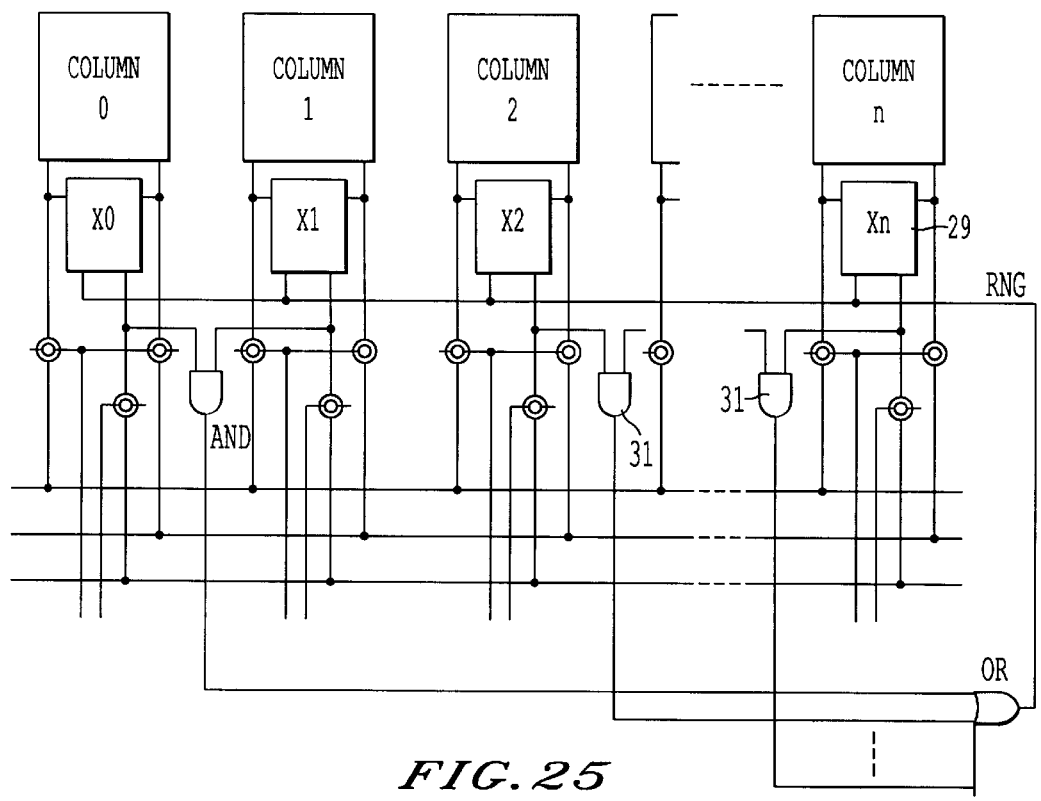
FIG. 25 is a circuit diagram of a column output section of the memory for a display of the present invention.

FIG. 25 shows another example of the error detection circuit in the case where the self test memory circuit 29 is arranged in the column section. When errors exist in both column addresses adjacent to each other, in order to form a constitution which requires repairing for these column addresses, the circuit shown in FIG. 25 carries out the logical AND between the two comparison circuits 29 adjacent to each other. If the logical SUM of the logical AND is positive, the row address at that time is judged as NG. An output of the comparison result signal toward the column direction is cut by the row address NG signal (RNG). The row address at that time is stored in the NG address memory of the repair circuit. When the row address NG signal is not outputted, the column address NG signal is outputted.

In the case where the circuit of FIG. 24 is used as the self test memory circuit (Xi) 29 shown in FIG. 25, the same operation can be performed if the RNG signal is used as the reset signal for the shift register SRR having a reset terminal.

The column address NG signal is held until the column address is selected according to the column address error check sequence. When the column address is selected, if the column address signal is in a risen state, the address at this time is stored in the NG address memory of the repair circuit. As a result, when the address to be repaired comes round, repairing is performed. Either a method in which the column address is selected by a normal operation or a method in which the column address is generated for testing by the counter may be satisfactory.

Figure 26:
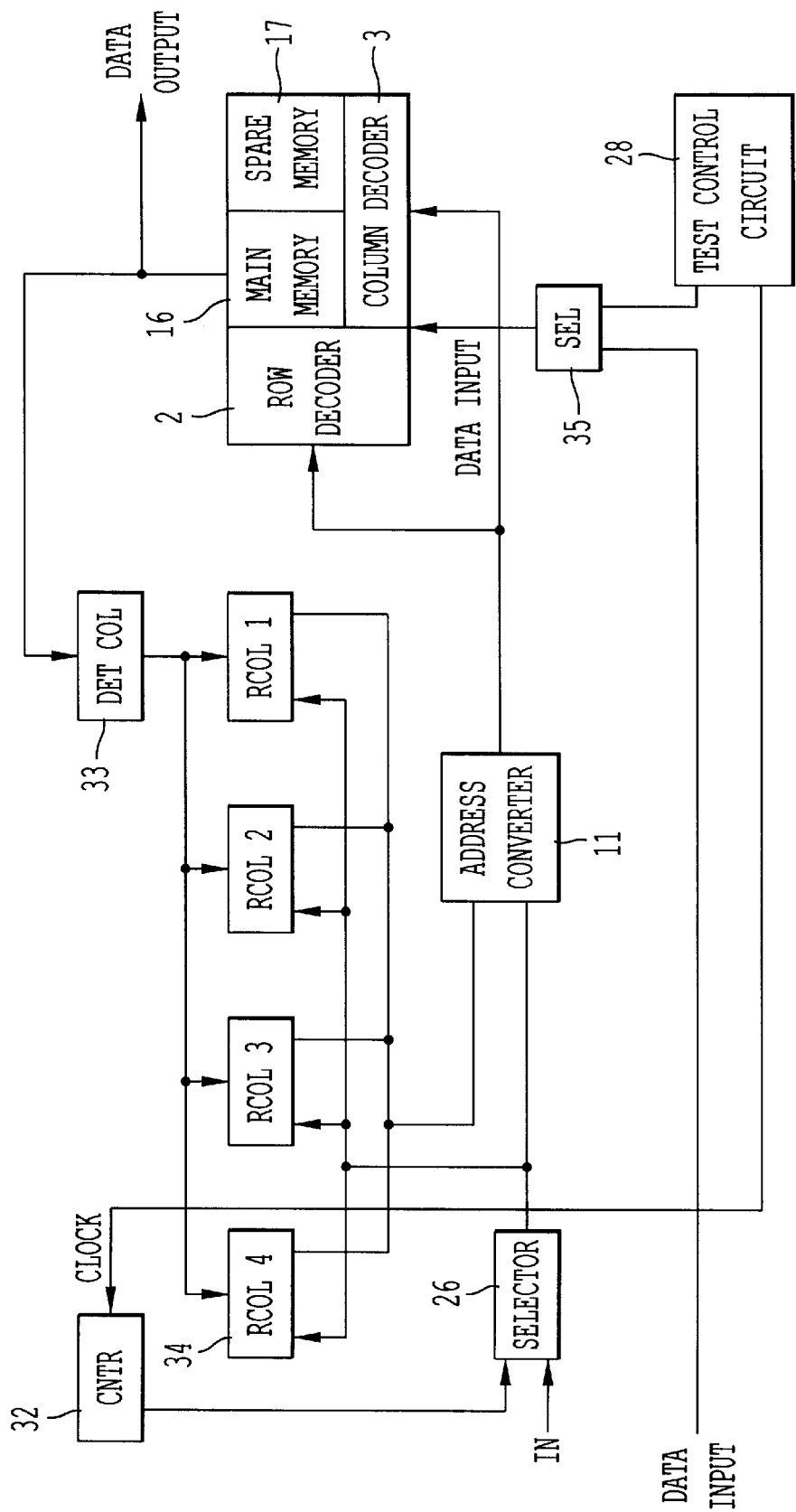
FIG. 26 is a circuit block diagram of a memory for a display including an address exchanging circuit of the present invention.

Next, a twelfth embodiment of the present invention will be described with reference to FIG. 26. Referring to FIG. 25, the address generation counter (CNTR) 32 used for the self test sequentially changes the row address at the time of column address error detection test while fixing the column address. After the row address makes a round, the column address is changed (for example, the address is incremented by one). The column detection circuit (DETCOL) 33 comprises a counter to perform resetting when the column address is changed, and counts the number of times of NG that is judged by the memory data detection circuit. When the memory data detection circuit detects the predetermined number of errors, for example, the four faulty addresses, the column address is regarded as the faulty one.

The faulty column address memory circuit (RCOL1, 2, 3 and 4) 34 takes in the address at this detection timing, and holds the faulty column address. When the RCOL1 circuit takes in the faulty column address, the RCOL1 enables the RCOL2 circuit to operate. Similarly, the RCOL3 circuit is enabled to operate, when the RCOL2 circuit takes in the faulty column address. In case where the RCOL1 circuit does not take in the faulty column address, that is, in the case where no faulty column address exist, the following column address spare operation is inhibited.

At the time of the actual use, the column address is compared with that of the RCOL circuit, and when both addresses coincide, the operation of the circuit of the original address is stopped and the column address is switched to the spare column address. FIG. 26 shows an example of a circuit in which in the RCOL circuit a faulty address memory of four sets of column address circuits, and the comparison circuit are provided. In case of the first faulty address, the first spare address is set, and in case of the second faulty address, the second spare address is set. Similarly, the third and fourth spare addresses are set. Four sets of faulty column addresses at maximum can be relieved.

In this embodiment of the present invention, the circuit for switching the column address to the spare address is described. In the memory circuit for use in such as videos, the column address can be interchanged with the periphery address.

Figure 27:
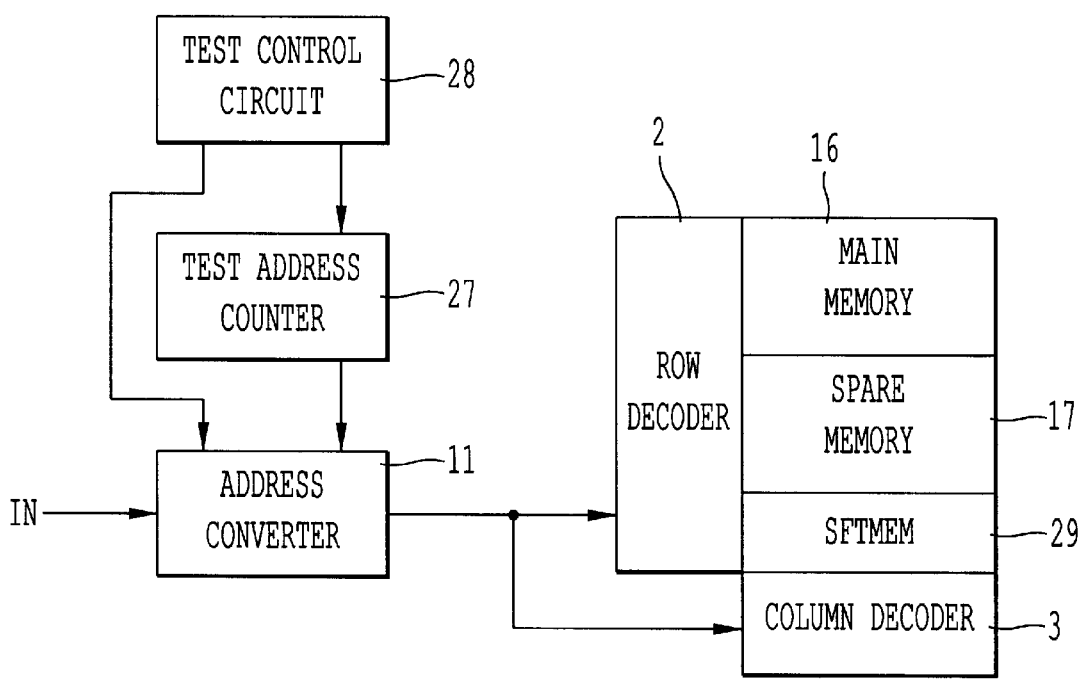
FIG. 27 is a circuit block diagram of a memory for a display including an address exchanging circuit of the present invention.

Next, a thirteenth embodiment of the present invention will be described with reference to FIG. 27. As shown in FIG. 27, in the memory cell array, included are the main memory 16, the spare memory 17 and the self test memory circuit (SFTMEM) 29. The self test memory circuit 29 has the same circuit structure as the column spare circuit, and the self test is performed for each column address. Specifically, for the row address subjected to the self test, the self test memory circuit 29 conducts the memory operation such as reading/writing operation of data. First, the stored content of the row address to be first tested is copied in the self test memory circuit 29. After completion of this operation, the address that is tested at the timing of the actual operation is converted to the address of the self test memory circuit 29.

Upon completion of the self test, the memory content of the self test memory circuit 29 is copied, and thereafter the address conversion is stopped. It is possible to constitute the self test circuit memory circuit so as to be the same as the column spare. The test address counter 27 and the test control circuit 28 constitute, for example, the self test circuit 14 of FIG. 4.

Figure 28:
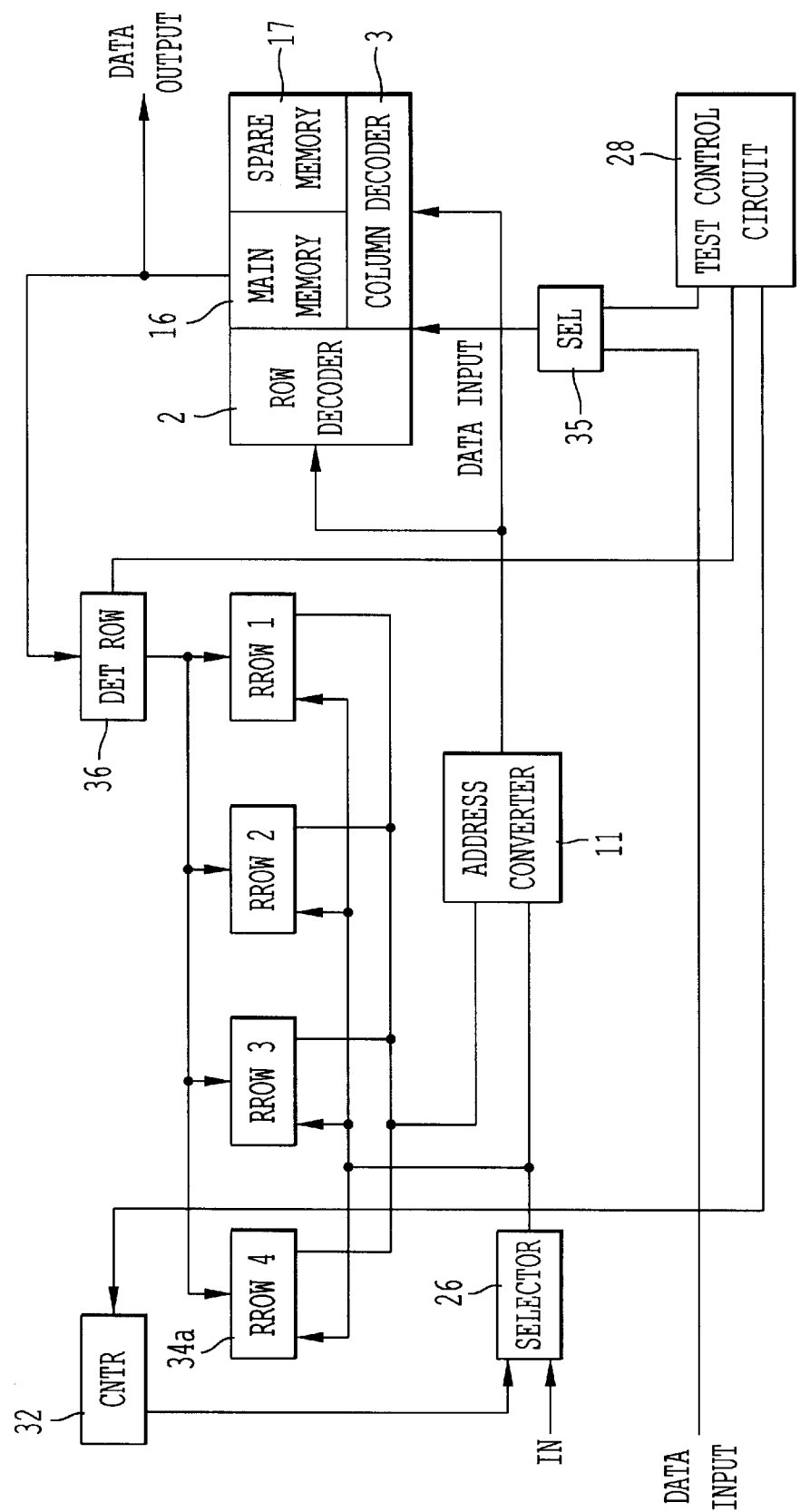
FIG. 28 is a circuit block diagram of a memory for a display including an address exchanging circuit of the present invention.
Figure 29:
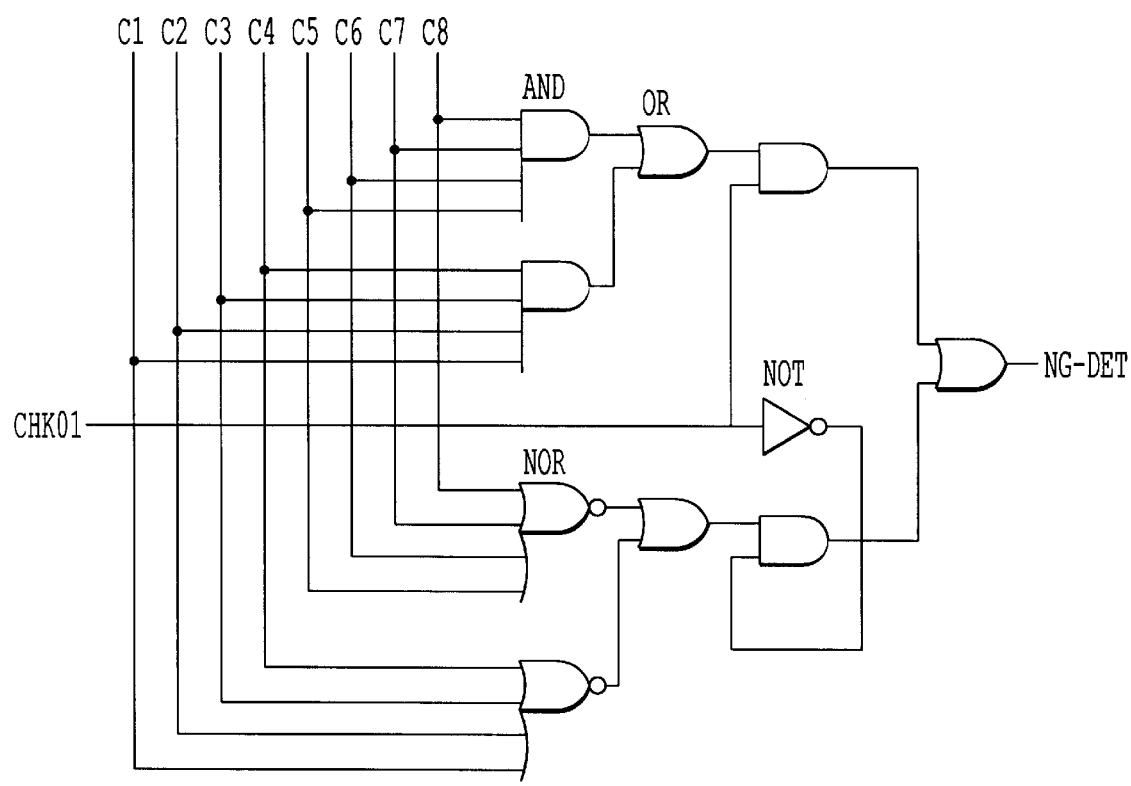
FIG. 29 is a circuit diagram of a row address detection circuit used in the memory for a display of the present invention.

Next, a fourteenth embodiment of the present invention will be described with reference to FIGS. 28 and 29. Referring to FIG. 28, the row address detection circuit (DETROW) 36 is a circuit which checks a logical AND of outputs of the memory data detection circuit for a plurality of columns. An example of the DETROW circuit 36 is shown in FIG. 29. Reference numerals c1 to c8 denote a column output signal from the memory section. When the levels of the signal c1 to c8 should by nature be "L", that is, at this time, the control signal chk01 is "H", if all of the signals c1 to c4 are "H" or if all of the signals c5 to c8 are "H", the row address is judged to be NG, and the NG-det output is made "H". When the column output signal should be originally "H", if the four signals are simultaneously NG, the NG-det output is "H".

As described above, when the memory data of a plurality of columns (four columns in case of FIG. 29) are simultaneously NG, the row address is judged to be faulty by the row address detection circuit 36, and the faulty row address memory circuit (RROW1, 2, 3 and 4) 34 gets in the row address at a detection timing, thereby holding the faulty row address.

When the RROW1 circuit takes in the faulty row address, the RROW1 circuit enables the EEOW2 circuit to operate. Similarly, when the RROW 2 circuit takes in the faulty row address, the RROW3 circuit becomes enable. In the case where the RROW1 circuit do not take in the faulty row address, that is, in the case where no faulty row address exists, the following row address spare operation is inhibited.

At the time of the actual use, the row address and the row address of the RROW circuit 34 are compared. When both coincide with each other, an operation of the circuit of the original address is stopped, and the row address is switched to the spare row address.

FIG. 28 shows an example of a circuit in which in the RROW circuit a faulty address memory of four sets of column address circuits, and the comparison circuit are provided. In case of the first faulty address, the first spare address is set, and in case of the second faulty address, the second spare address is set. Similarly, the third and fourth spare addresses are set. Four sets of faulty column addresses at maximum can be relieved.

In the example of the drawing, the circuit for switching the column address to the spare address is described. In the memory circuit for use in such as images, the column address can be interchanged with the periphery address as in the second embodiment of the present invention.

Figure 30:
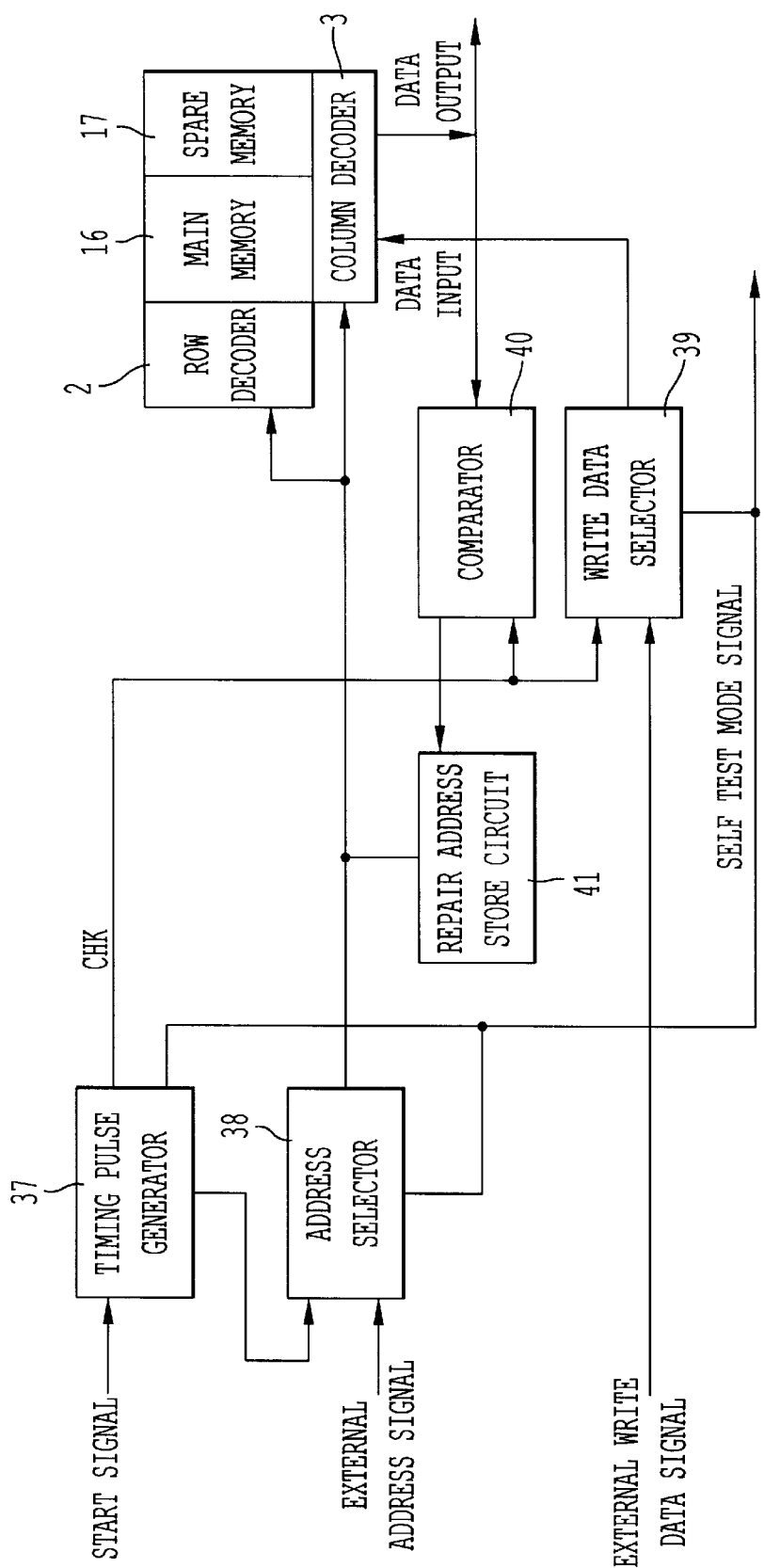
FIG. 30 is a circuit block diagram of a memory for a display, including an address exchanging circuit of the present invention.
Figure 31:
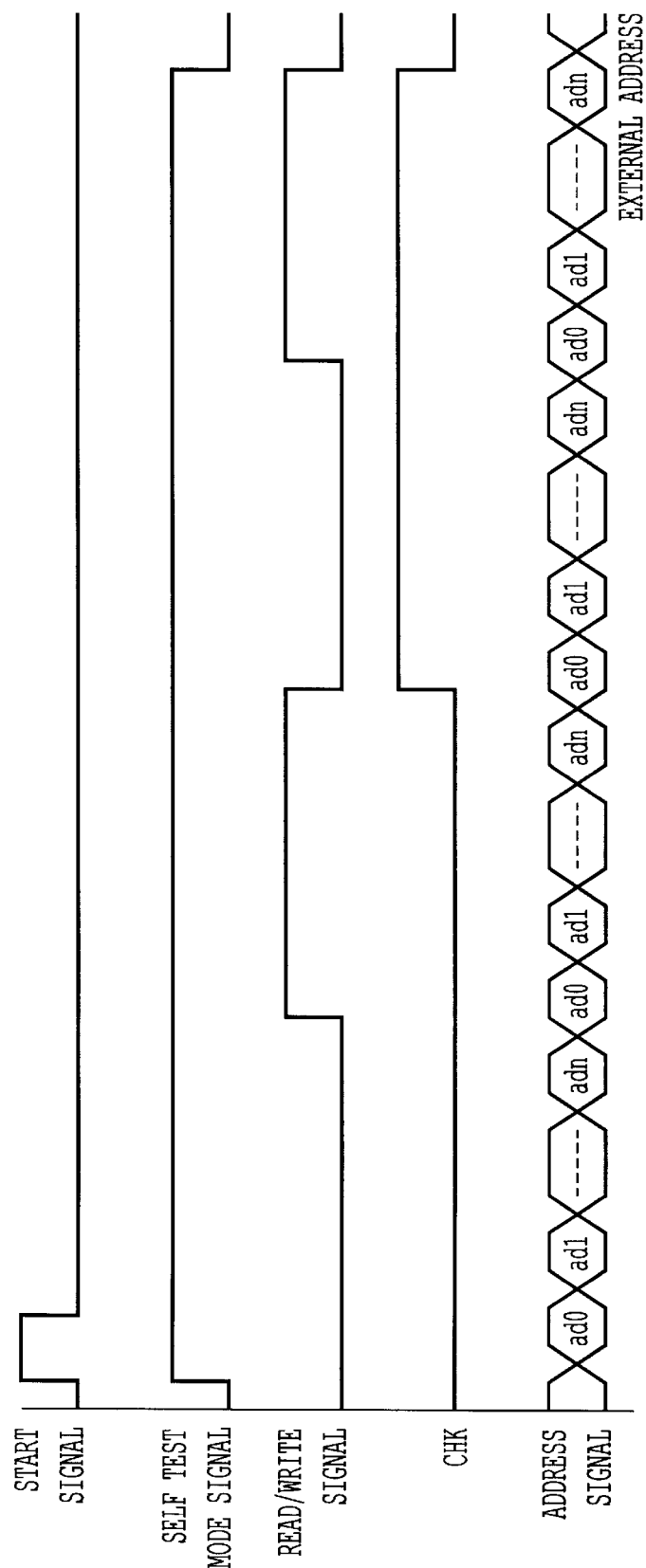
FIG. 31 is a timing chart of a signal during operations of the memory for a display of the present invention.

Next, the self test circuit of the present invention will be described with reference to FIGS. 30 and 31. The self test circuit of FIG. 30 is a circuit which performs a test for the whole of the memory at a time at the time of power-on. This self test circuit comprises a timing generation circuit (TMG) 37 which generates various kinds of timing signals of FIG. 31 in response to a start signal such as a power-on signal and finishes a self test mode upon completion of the self test; the address selection circuit (ADSE) 38 which switches the address to the address from the timing generation circuit 37 when the self test mode signal is "H"; the writing data selection circuit (WDSE) 39 which switches the writing data signal to the signal CHK from the timing generation circuit 37 when the self test mode signal is "H"; the comparison circuit (CMP) 40 which compares the reading-out signal and the expected value supplied from the timing generation circuit 37; and the repair address storing circuit (RADS) 44 which when the memory cell is judged to be faulty by the comparison circuit 40, stores the address of the faulty memory cell.

An operation of this self test circuit will be described. The start signal is the one indicating that the DRAM comes to a state where it can normally operate after the power-on, the one outputted from a system using the DRAM when the DRAM can cease its operation during the self test, or the one at the time of test on shipping of IC. The self mode signal is generated in response to the start signal from the timing generation circuit 37, and the self mode signal is kept at "H" until any of the following situations is created.

①  In the case where all of the memory cells are checked and the faulty address is detected, the storing of the faulty address in the repair address store circuit 41 is completed.

② The larger number of the faulty addresses than those capable of being repaired are detected.

By the self test mode signal, the address becomes a signal generated in the timing generation circuit 37 by the address selection circuit 38, and the writing data becomes the CHK signal of the timing generation circuit 37 by the writing data selection circuit 39.

First, the CHK signal is set to be "L", and counting in the timing generation circuit 37 is incremented sequentially. After writing is completed for all of the memory, all of the memory are sequentially read out and are compared with the CHK signal ("L"). In the case where the address is regarded as the faulty address as a result of the comparison, this address is taken into the repair address store circuit 41. The address taken into the repair address store circuit 41 is compared with the external address during the normal operation, and when both coincide, the address is sued for performing the repair operation.

When checking of all addresses is completed, the self test mode signal becomes "L", and the possibility of use of this image memory of the present invention is transmitted to the system which uses this DRAM. The address is switched to the external address, and the writing data is also changed to the external writing data signal. In the case where the larger number of faulty addresses than those capable of being repaired are detected, the impossibility of repairing is transmitted to the system.

The present invention exhibits the following advantages.

(1) The memory for controlling a display is capable of exhibiting similar effects to that without provision of the spare memory, leading to a decrease in cost of the memory of the present invention.

(2) Evaluation equipment for the spare memory and processes for it are unnecessary, so that it is possible to decrease cost of the memory of the present invention.

(3) With preparation of the repair memory of the same scale as the conventional one, it is possible to cope with errors more than those of the conventional memory, resulting in an increase in a yield rate. In spite of the fact that the repair memory is omitted, since it is possible to achieve the same yield rate, a reduction in a chip size is possible, whereby a reduction in cost can be achieved in any case.

(4) In the case where data at the specified periphery of the display is undesirable, such situation can be avoided.

(5) Since operation conditions are severer than at the time of power-on, it is possible to perform a repair of a disadvantage that errors occur due to a fluctuation of the operation margin of the memory circuit owing to a change of temperature.

(6) It is unnecessary to additionally provide the address counter for the self test, so that a chip size can be reduced.

(7) The self test operation and the normal operation can be performed in parallel, so that an operation speed of the memory can be increased.

(8) When the spare memory is used as the test memory like the present invention, the chip size can be reduced.

(9) When the memory circuit portion for the self test is disposed in the column circuit of the memory cell array, the wiring portion is made small, so that many circuits an be arranged and the self test can be carried out at a high speed.

(10) With provisions of many test memory circuits, it is possible to carry out the self test.

(11) Although checking for many addresses are possible, the number of interconnections can be minimized.

(12) The relieving method can be varied between the row line errors and the column line errors, so that a possibility of relieving can be widened.

Because the present invention can obtain the same degree of effects without provision of the spare memory, a reduction in cost as well as in a chip size can be achieved. With preparation of the repair memory of the same scale as the conventional one, it is possible to cope with errors more than those of the conventional memory, resulting in an increase in a yield rate. In spite of the fact that the repair memory is omitted, since it is possible to achieve the same yield rate, a reduction in a chip size is possible, whereby a reduction in cost can be achieved in any case. It is unnecessary to additionally provide the address counter for the self test, so that a chip size can be reduced. The self test operation and the normal operation can be performed in parallel, so that an operation speed of the memory can be increased.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A memory for a display comprising:
    a memory cell array;
    an external address input section;
    a first memory circuit which stores an address corresponding to a specified portion of a display;
    a second memory circuit which stores an address proved to be faulty as a result of a test for said memory cell array; and
    an address converting circuit coupled to said external address input section and said first and second memory circuits,
    wherein said address converting circuit outputs the address stored in said second memory circuit when an address supplied from said external address input section coincides with the address stored in said first memory circuit and outputs the address stored in said first memory circuit when the address supplied from said external address input section coincides with the address stored in said second memory circuit, and
    memory cells corresponding to the address stored in the first and second memory circuit are both used according to the converted address.

2. The memory according to claim 1, wherein said address converting circuit is coupled to a row decoder and a column decoder.

3. The memory according to claim 1, further comprising:
    a test circuit which checks all memory addresses and allows said second memory circuit to store the address among said all memory addresses therein, which is proved to be faulty as the result of the test.

4. The memory according to claim 1, wherein said first memory circuit stores an address corresponding to a periphery of a display.

5. The memory according to claim 1, further comprising:
    a circuit for performing a self test in the order of addresses during an actual operation and for exchanging an address proved to be faulty with others as a result of the test.

6. The memory according to claim 5, wherein a counter for a refresh is used for an address generation of the self test.

7. The memory according to claim 6, further comprising:
a test memory circuit,
wherein the test is performed in such manner that during an actual operation, data is written to said test memory circuit as well as a memory cell of an address to be tested, and both of data written to said test memory circuit and said memory cell are compared.

8. The memory according to claim 7, further comprising a spare memory, wherein said self test memory circuit uses said spare memory.

9. The memory according to claim 7, wherein said self test memory circuit is arranged in a column section of a memory cell array of said self test memory circuit.

10. The memory according to claim 9, wherein said self test memory circuit is arranged in a column section of a memory cell array of said self test memory circuit, and
a plurality of circuits are provided for the larger number of column addresses than column addresses selected during a normal operation, the circuits performing the test simultaneously.

11. The memory according to claim 7, wherein said self test memory circuit is arranged in a column section of a memory cell array of said self test memory circuit, and
a plurality of circuits are provided for the larger number of column addresses than column addresses selected during a normal operation, the circuits performing the test simultaneously.

12. The memory according to claim 5, further comprising:
a test memory circuit,
wherein the test is performed in such manner that during an actual operation, data is written to said test memory circuit as well as a memory cell of an address to be tested, and both of data written to said test memory circuit and said memory cell are compared.

13. The memory according to claim 12, further comprising a spare memory, wherein said self test memory circuit uses said spare memory.

14. The memory according to claim 12, wherein said self test memory circuit is arranged in a column section of a memory cell array of said self test memory circuit.

15. The memory according to claim 14, wherein said self test memory circuit is arranged in a column section of a memory cell array of said self test memory circuit, and
a plurality of circuits are provided for the larger number of column addresses than column addresses selected during a normal operation, the circuits performing the test simultaneously.

16. The memory according to claim 12, wherein said self test memory circuit is arranged in a column section of a memory cell array of said self test memory circuit, and
a plurality of circuits are provided for the larger number of column addresses than column addresses selected during a normal operation, the circuits performing the test simultaneously.

17. The memory according to claim 5, further comprising:
a circuit which holds a judgment result of an address of the memory when the address is proved to be faulty, and sets a column address as an address to be repaired when said column address is selected.

18. The memory according to claim 5, further comprising:
a circuit which performs a test for each row address, sets a certain address as a faulty row address when a plurality of faulty are found at one row address, and judges a column address as a good one as a result of a judgement of said column address.

19. The memory according to claim 1, wherein said specified portion of said display comprises a peripheral portion of said display.

20. A memory for a display comprising:
an external address input section;
a memory circuit section including a row address decoder, a column address decoder and a memory cell array having row lines and column lines; and
a circuit, shared by said row lines and said column lines of said memory cell array, capable of exchanging a row address and a column address with each other in response to a control signal at the time of repairing said row lines and said column lines of said memory cell array.

21. The memory according to claim 20, further comprising:
a self test circuit which examines whether a memory cell operates normally,
wherein as a result of a test by said self test circuit, an address of an operation of which is proved to be abnormal is interchanged with an address for a spare memory.

22. The memory according to claim 20, further comprising:
a circuit for designating in response to an external signal an address to be interchanged with which position of a periphery of a display.

23. The memory according to claim 20, further comprising:
a circuit for performing a self test in the order of addresses during an actual operation and for exchanging an address proved to be faulty with others as a result of the test.

24. The memory according to claim 23, wherein a counter for a refresh is used for an address generation of the self test.

25. The memory according to claim 24, further comprising:
a test memory circuit,
wherein the test is performed in such manner that during an actual operation, data is written to said test memory circuit as well as a memory cell of an address to be tested, and both of data written to said test memory circuit and said memory cell are compared.

26. The memory according to claim 25, further comprising a spare memory, wherein said self test memory circuit uses said spare memory.

27. The memory according to claim 25, wherein said self test memory circuit is arranged in a column section of a memory cell array of said self test memory circuit.

28. The memory according to claim 27, wherein said self test memory circuit is arranged in a column section of a memory cell array of said self test memory circuit, and
a plurality of circuits are provided for the larger number of column addresses than column addresses selected during a normal operation, the circuits performing the test simultaneously.

29. The memory according to claim 25, wherein said self test memory circuit is arranged in a column section of a memory cell array of said self test memory circuit, and
a plurality of circuits are provided for the larger number of column addresses than column addresses selected during a normal operation, the circuits performing the test simultaneously.

30. The memory according to claim 23, further comprising:
a test memory circuit,
wherein the test is performed in such manner that during an actual operation, data is written to said test memory circuit as well as a memory cell of an address to be tested, and both of data written to said test memory circuit and said memory cell are compared.

31. The memory according to claim 30, further comprising a spare memory, wherein said self test memory circuit uses said spare memory.

32. The memory according to claim 30, wherein said self test memory circuit is arranged in a column section of a memory cell array of said self test memory circuit.

33. The memory according to claim 32, wherein said self test memory circuit is arranged in a column section of a memory cell array of said self test memory circuit, and
a plurality of circuits are provided for the larger number of column addresses than column addresses selected during a normal operation, the circuits performing the test simultaneously.

34. The memory according to claim 30, wherein said self test memory circuit is arranged in a column section of a memory cell array of said self test memory circuit, and
a plurality of circuits are provided for the larger number of column addresses than column addresses selected during a normal operation, the circuits performing the test simultaneously.

35. The memory according to claim 23, further comprising:
a circuit which holds a judgment result of an address of the memory when the address is proved to be faulty, and sets a column address as an address to be repaired when said column address is selected.

36. The memory according to claim 23, further comprising:
a circuit which performs a test for each row address, sets a certain address as a faulty row address when a plurality of faulty are found at one row address, and judges a column address as a good one as a result of a judgement of said column address.

* * * * *